(12) United States Patent
Suma et al.

(10) Patent No.: US 7,446,009 B2
(45) Date of Patent: Nov. 4, 2008

(54) MANUFACTURING METHOD FOR SEMICONDUCTOR DEVICE

(75) Inventors: Daichi Suma, Gunma-ken (JP);
Yoshikazu Ibara, Gifu-ken (JP);
Tatsuhiko Koide, Gifu-ken (JP); Koichi Saito, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 174 days.

(21) Appl. No.: 11/594,986

(22) Filed: Nov. 9, 2006

(65) Prior Publication Data

US 2007/0111459 A1    May 17, 2007

(30) Foreign Application Priority Data

Nov. 11, 2005 (JP) ............................ 2005-327589
Nov. 28, 2005 (JP) ............................ 2005-341565
Nov. 2, 2006 (JP) ............................ 2006-298384

(51) Int. Cl.
*H01L 21/331* (2006.01)
(52) U.S. Cl. .................. 438/309; 438/365; 438/368
(58) Field of Classification Search .......... 438/309, 438/365, 366, 368, 343
See application file for complete search history.

(56) References Cited

U.S. PATENT DOCUMENTS 5,316,957 A * 5/1994 Spratt et al. ............... 438/311
7,005,359 B2 * 2/2006 Ahmed et al. ............. 438/366

FOREIGN PATENT DOCUMENTS

JP          4-179235 A       6/1992

* cited by examiner

*Primary Examiner*—Tuan H Nguyen
(74) *Attorney, Agent, or Firm*—McDermott Will & Emery LLP

(57) ABSTRACT

A semiconductor device manufacturing method including forming a conductive layer and a silicon film on a semiconductor substrate including an active region, forming an emitter electrode containing a first impurity on the silicon film above the active region, partially etching the silicon film using the emitter electrode as a mask, forming an insulative film covering the semiconductor substrate and a side wall film covering a side surface of the emitter electrode, introducing a second impurity into the conductive layer and silicon film so that the second impurity reaches the active region to form an impurity region containing the second impurity in parts of the conductive layer and silicon film, and diffusing the first impurity contained in the emitter electrode into the silicon film to form in the silicon film a first region containing the first impurity and a second region free of the first impurity.

18 Claims, 22 Drawing Sheets

MANUFACTURING METHOD FOR SEMICONDUCTOR DEVICE

CROSS-REFERENCE TO RELATED APPLICATIONS

This application is based upon and claims the benefit of priority from prior Japanese Patent Application Nos. 2005-327589 filed on Nov. 11, 2005, 2005-341565 filed on Nov. 28, 2005, and 2006-298384 filed on Nov. 2, 2006, the entire contents of which are incorporated herein by reference.

BACKGROUND OF THE INVENTION

The present invention relates to a manufacturing method for a semiconductor device.

The market not only demands sophistication for portable electronics devices, such as mobile telephones, PDAs (personal digital assistants), DVCs (digital video cameras), and DSCs (digital still cameras), but also demands compact and lightweight products. Highly integrated system LSI (large scale integration) technology is one solution to meet such market demands.

One example for realizing a highly integrated system LSI is a high-frequency bipolar transistor. To enable a high-frequency bipolar transistor to have higher performance, a heterojunction bipolar transistor including a base layer fabricated with a silicon-germanium (SiGe) alloy has been proposed. FIGS. 1 and 2 show the structure of a conventional heterojunction bipolar transistor including a SiGe alloy base layer described in Japanese Laid-Open Patent Publication No. 4-179235.

In FIG. 1, an n$^-$-type layer (epitaxial layer) 102, which functions as a collector layer, is epitaxially grown on a p$^-$-type silicon substrate (not shown) with an N$^+$-type collector embedment layer 101 arranged in between. The n$^-$-type layer 102 is etched to remove unnecessary portions and leave only the necessary portions, such as portions corresponding to a collector layer and a collector lead layer. A trench is formed in an isolation region. A polycrystalline silicon film 104 is embedded in the trench by means of an oxide film 103. After the collector formation and the isolation region embedment, the surface of the silicon substrate is planarized using an oxide film (buried oxide film) 105. A base and an emitter are further epitaxially grown on the surface of the structure. More specifically, a p-type SiGe layer (SiGe alloy layer) 106, which functions as an internal base layer, is epitaxially grown on the surface of the structure. An n-type silicon layer 107, which functions as an emitter layer, and an N$^+$-type silicon layer 108, which functions as an emitter-contact layer (emitter electrode), are epitaxially grown on the p-type SiGe layer 106 sequentially in the stated order. The N$^+$-type silicon layer 108 and the n-type silicon layer 107 are etched using an oxide film 109 as a mask to remove unnecessary portions and leave necessary portions such as portions corresponding to an emitter. An oxide film (side wall film) 110 and the oxide film 109 are used as a mask, and a portion of the remaining p-type SiGe layer 106 surrounding the region that functions as an internal base layer is etched to a predetermined depth. A p$^+$-type SiGe layer 111, which functions as an external base layer, is formed through selective epitaxial growth on the portion surrounding the p-type SiGe layer 106.

In the conventional structure of the heterojunction bipolar transistor including the SiGe base layer shown in FIG. 2, the n-type silicon layer 107 functioning as an emitter layer has a reverse T.-shaped cross-section, and a contact surface 150 between the emitter layer 107 and the emitter electrode 108 is located above a lower surface 160 of the side wall film 110. As a result, an emitter-base junction portion is formed below a relatively narrow projection of the emitter layer 107. The width of the emitter-base junction portion, that is, the width $W_{e2}$ of the emitter layer is greater than the width $W_{e1}$ of the N$^+$-type silicon layer (emitter electrode) 108.

SUMMARY OF THE INVENTION

To manufacture a semiconductor device (heterojunction bipolar transistor including a SiGe base layer) having higher performance, the conventional structure reduces the width $W_{e2}$ of the emitter layer by miniaturizing the N$^+$-type silicon layer (emitter electrode) 108 and reducing the width $W_{e1}$. However, this requires the procurement and use of a high precision exposure apparatus and increases the manufacturing cost of the semiconductor device.

One aspect of the present invention is a method for manufacturing a semiconductor device. The method includes a first step of forming a conductive layer and a silicon film functioning as a base layer on a semiconductor substrate including an active region surrounded by an isolation film; a second step of forming an emitter electrode containing a first impurity on the silicon film above the active region; a third step of partially etching the silicon film using the emitter electrode as a mask; a fourth step of forming an insulative film entirely covering the semiconductor substrate and then etching back the insulative film to form a side wall film covering a side surface of the emitter electrode; a fifth step of introducing a second impurity into the conductive layer and the silicon film so that the second impurity reaches the active region to form an impurity region containing the second impurity in part of the conductive layer and part of the silicon film; and a sixth step of diffusing the first impurity contained in the emitter electrode into a surface of the silicon film to form in the silicon film a first region containing the first impurity and a second region free of the first impurity. The third step includes forming the silicon film to have a reversed T-shape so that a contact surface between the first region and the emitter electrode is located above a lower surface of the side wall film when the fourth step is completed. The sixth step includes forming the first and second regions in the silicon film so that at least part of the second region is positioned between the conductive layer and the side wall film and is in contact with both the conductive layer and the side wall film.

A further aspect of the present invention is a method for manufacturing a semiconductor device. The method includes a first step of forming a protective film having an opening on a semiconductor substrate including an active region surrounded by an isolation film, the active region having a surface arranged in the opening; a second step of forming a conductive layer and a silicon-film functioning as a base layer in the opening of the protective film; a third step of forming an emitter electrode containing a first impurity on the silicon film above the active region; a fourth step of partially etching the silicon film using the emitter electrode as a mask; a fifth step of forming a side wall film covering a side surface of the emitter electrode; a sixth step of introducing a second impurity into the conductive layer and the silicon film so that the second impurity reaches the surface of the active region to form an impurity region containing the second impurity in parts of the conductive layer and silicon film; and a seventh step of diffusing the first impurity contained in the emitter electrode into the silicon film to form a first region containing the first impurity and a second region free of the first impurity in the silicon film. The fourth step includes forming the silicon film to have a reversed T-shape so that a contact surface between the first region and the emitter electrode is located above a lower surface of the side wall film when the fifth step is completed. The seventh step includes forming the first and second regions in the silicon film so that at least part of the second region is positioned between the conductive layer and the side wall film and is in contact with both the conductive layer and the side wall film.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 3:
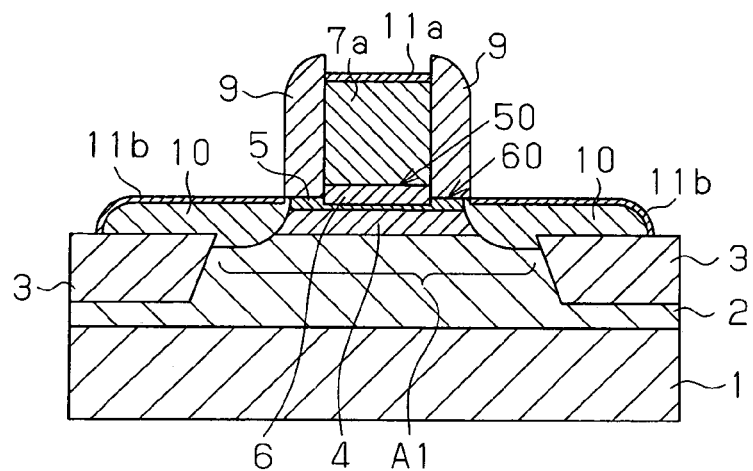
FIG. 3 is a cross-sectional view of a semiconductor device according to a first embodiment of the present invention.
Figure 4:
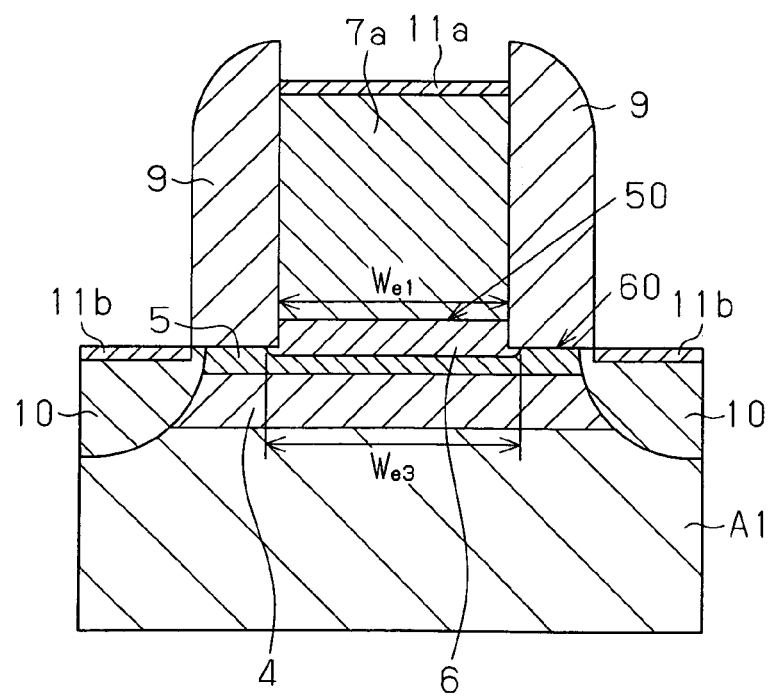
FIG. 4 is a partially enlarged view of the semiconductor device of FIG. 3.

A semiconductor device according to a first embodiment of the present invention will now be described with reference to FIGS. 3 and 4. FIG. 3 is a cross-sectional view of a heterojunction bipolar transistor including a SiGe base layer as one example of the semiconductor device of the present invention. FIG. 4 is a partially enlarged view of the semiconductor device of FIG. 3 focusing on its emitter-base region.

As shown in FIG. 3, an epitaxial layer 2, which functions as a collector layer, is formed on a p-type silicon substrate 1, which functions as a semiconductor substrate, and an isolation film 3, which realizes an STI (shallow trench isolation) structure, is formed on part of the epitaxial layer 2. A portion of the epitaxial layer 2 surrounded by the isolation film 3 functions as an active region A1. An SiGe alloy layer 4, which functions as a base region, is formed on the active region A1. A silicon film 5 and an n-type diffusion layer 6 are formed on the SiGe alloy layer 4. The n-type diffusion layer 6 functions as an emitter layer. The n-type diffusion layer 6 is formed by diffusing an n-type impurity on a projection 70 (refer to FIG. 9) of the silicon film 5. The silicon film 5 prior to diffusion of the n-type impurity has a reverse T-shaped cross-section. A polycrystalline silicon film 7a and a silicide film 11a are formed on the n-type diffusion layer 6. The n-type diffusion layer 6, the polycrystalline silicon film 7a, and the silicide film 11a are surrounded by a side wall film 9, which is formed by an insulative film. A contact surface 50 between the n-type diffusion layer 6 and the polycrystalline silicon film 7a is located above a lower surface (bottom) 60 of the side wall film 9. Part of the silicon film 5 is located between the side wall film 9, which is formed by an insulative film, and the SiGe alloy layer 4 and is in contact with both the side wall film 9 and the SiGe alloy layer 4. A p⁺ diffusion layer 10, which is connected to a base region, surrounds the silicon film 5. A silicide film 11b, which is used as a low resistance layer of an external base layer, is formed on the surface of the p⁺ diffusion layer 10.

In the present invention, a conductive layer includes a semiconductor layer containing a p-type or n-type impurity to obtain conductivity. The SiGe alloy layer 4 is one example of the conductive layer. The silicon film 5 is one example of a second region. The n-type diffusion layer 6 is one example of a first region. The polycrystalline silicon film 7a is one example of an emitter electrode. The p⁺ diffusion layer 10 is one example of an impurity region.

A process for manufacturing the semiconductor device of the first embodiment will now be described with reference to FIGS. 5 to 13.

Figure 5:
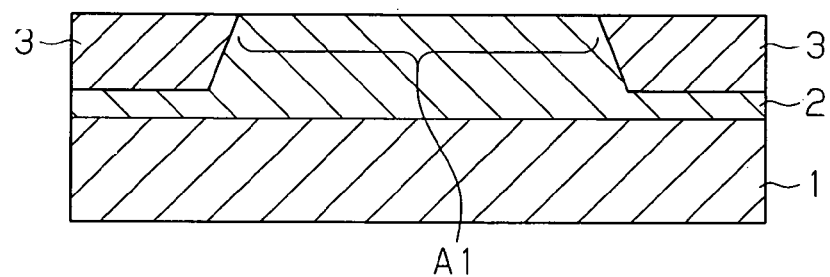
FIGS. 5 to 13 are cross-sectional views describing a manufacturing method for the semiconductor device of FIG. 3.

[Process 1: FIG. 5]

An isolation film 3 for STI or the like is formed on a p-type silicon substrate 1. Then, an n-type impurity is ion-implanted and activated to form an active region A1 (collector layer 2). For example, phosphorus (P) is implanted with electron acceleration energy in a range of about 500 to 4000 keV to have a concentration in a range of about $3\times10^{13}$ to $3\times10^{15}$ cm$^{-2}$.

Figure 6:
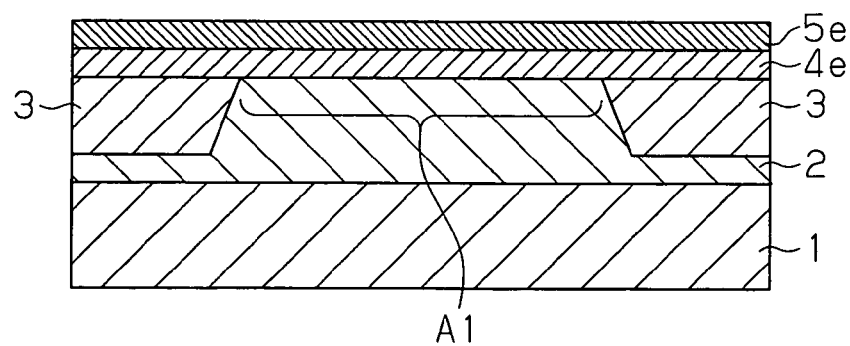

[Process 2: FIG. 6]

A silicon-germanium (SiGe) alloy layer 4e, which is doped with boron (B) at a concentration of about $1\times10^{19}$ $^{cm-3}$, and a silicon film 5e, which does not contain germanium (Ge), are epitaxially grown by low-pressure CVD (chemical vapor deposition). The thickness of each of the SiGe alloy layer 4e and the silicon film 5e is preferably controlled in a range of about 10 to 100 nm.

The concentration of Ge in the SiGe alloy layer 4e may be uniform throughout the entire layer. Alternatively, the SiGe alloy layer 4e may have a gradient Ge concentration profile that gradually increases the Ge concentration from the side that comes into contact with the silicon film 5e toward the side that comes into contact with the collector layer 2. Such a gradient Ge concentration profile shortens the time taken by electrons to travel through a base layer and enables the transistor to operate at higher speeds. In this case, it is preferable that the Ge concentration be substantially about 0% at the side contacting the silicon film 5e and about 15 to 20% at the side contacting the collector layer 2.

The silicon film 5e may also be doped with boron in the same manner as the SiGe alloy layer 4e but does not have to be doped with boron.

Before the SiGe alloy layer 4e is formed, a silicon film that does not contain boron or a SiGe alloy layer that does not contain boron may be epitaxially grown by low-pressure CVD.

Figure 7:
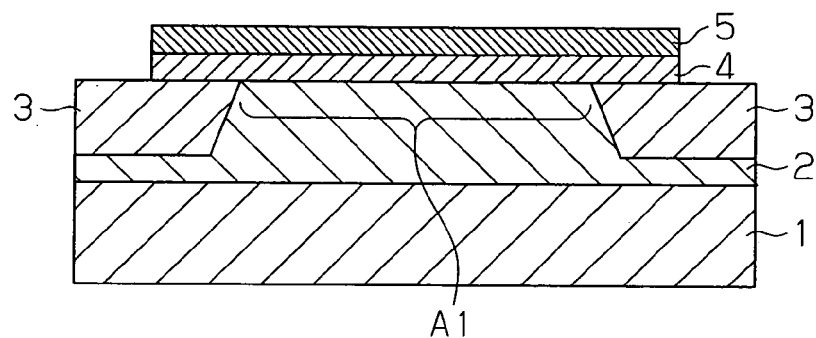

[Process 3: FIG. 7]

A resist pattern is formed by performing lithography. Unnecessary portions of the silicon film 5e and the SiGe alloy layer 4e are removed by performing dry etching. As a result, a SiGe alloy layer 4 that is used as a base region and a silicon film 5 are formed with a predetermined pattern on the active region A1. The dry etching may be performed, for example, under conditions in which the pressure: 2.0 Pa (15 mT); the gas flow rate $O_2$/HBr: 2/180 ml/minute (sccm); and the RF power Upper/Lower: 250W/12W.

Figure 8:
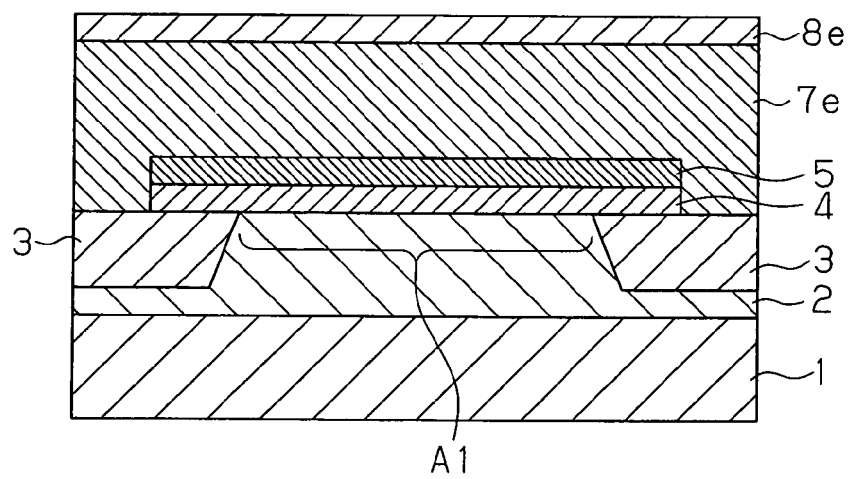

[Process 4: FIG. 8]

A polycrystalline silicon film 7e, which is doped with an n-type impurity at a concentration of about $1 \times 10^{20}$ cm$^{-3}$ or more, is formed by performing low-pressure CVD. A silicon nitride film 8e is formed on the polycrystalline silicon film 7e. Arsenic (As) or phosphorus (P) may be used as the n-type impurity. The thickness of the polycrystalline silicon film 7e is preferably controlled in a range of about 100 to 300 nm. The thickness of the silicon nitride film 8e is preferably controlled in a range of about 50 to 200 nm. The n-type impurity is one example of a first impurity.

Figure 9:
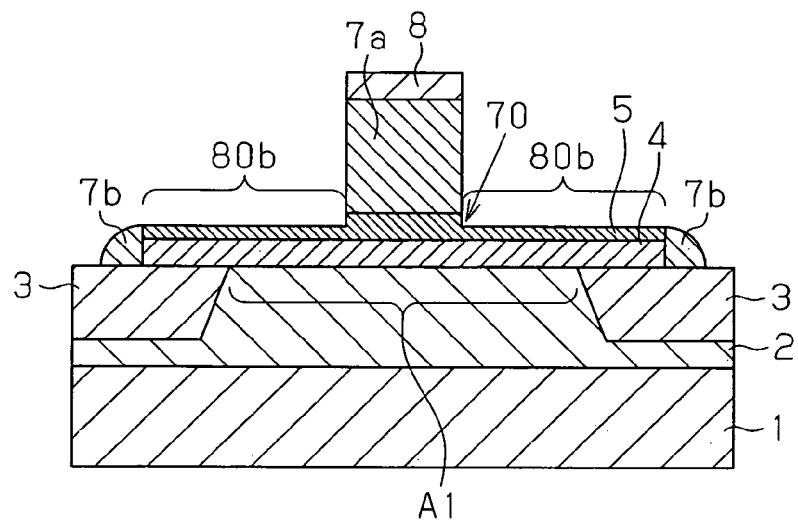

[Process 5: FIG. 9]

A resist pattern is formed by performing lithography. The silicon nitride film 8e, the polycrystalline silicon film 7e, and the silicon film 5 are etched by performing dry etching sequentially in the stated order. The dry etching is preferably controlled to process the silicon film 5 to be partially thin. More specifically, the dry etching is not continued until the silicon film 5 is completely removed, but is stopped in a state in which the silicon film 5 still remains on the entire surface of the SiGe alloy layer 4. As a result, the silicon film 5 is processed to have a reverse T-shaped cross-section with a projection 70. Further, an exposed surface 80a of the silicon film 5 is damaged by the etching so as to form a damaged layer on the exposed surface 80a. The polycrystalline silicon film 7e is processed as a polycrystalline silicon film 7a, which functions as an emitter electrode, and as a side wall film 7b, which is formed by a polycrystalline silicon film and surrounds the SiGe alloy layer 4 and the silicon film 5. The silicon nitride film 8e is processed as a silicon nitride film 8 and functions as a mask when the polycrystalline silicon film 7e is etched. The dry etching may be performed, for example, under conditions in which the pressure: 2.0 Pa (15 mT); the gas flow rate $O_2$/HBr: 2/180 ml/minute (sccm); and the RF power Upper/Lower: 250 W/12 W.

Figure 10:
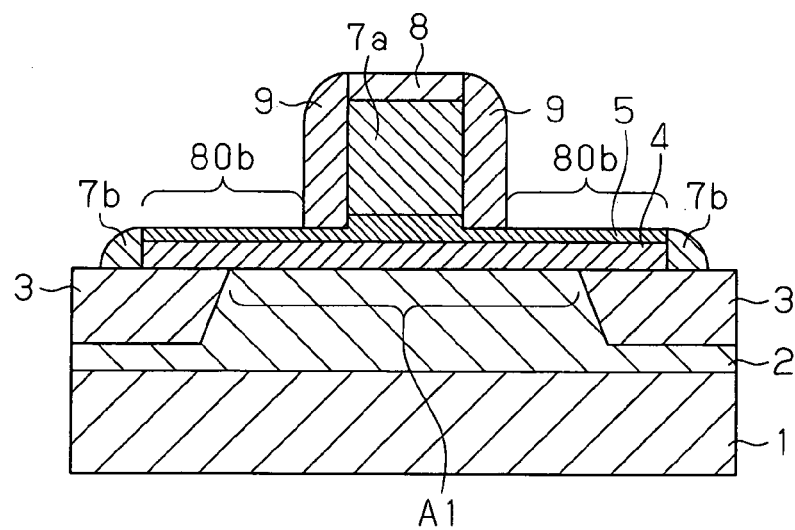

[Process 6: FIG. 10]

A silicon oxide film, which is an insulative film, is formed by performing CVD. Then, the entire film surface is etched back by performing dry etching so that a side wall film 9 formed by a silicon oxide film surrounds the silicon nitride film 8, the polycrystalline silicon film 7a, and the projection 70 of the silicon film 5. A surface 80b of the silicon film 5 is further damaged by the dry etching so as to form a damaged layer on the surface 80b. The silicon oxide film may be formed, for example, by heating a mixture of tetra ethoxy silane (TEOS) and oxygen ($O_2$) at about 720° C. The thickness of the silicon oxide film is preferably controlled in a range of about 100 to 400 nm. The dry etching may be performed, for example, under conditions in which the pressure: 33 Pa (250 mT); the gas flow rate $CHF_3/CF_4$/Ar: 20/20/400 ml/minute (sccm); and the RF power: 395 W.

Figure 11:
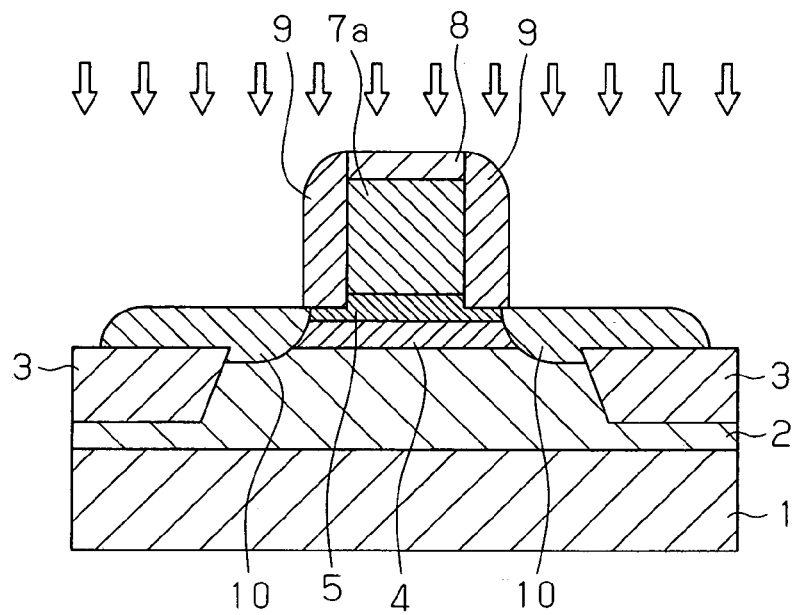

[Process 7: FIG. 11]

Boron is ion-implanted in the silicon oxide film by ion implantation. Then, heat treatment is performed to activate the film and form a p$^+$ diffusion layer 10, which functions as an external base layer. As one example, $BF_2$ may be implanted with electron acceleration energy in a range of about 1 to 40 keV to have a concentration in a range of $1 \times 10^{14}$ to $5 \times 10^{15}$ cm$^{-2}$. Under such ion implantation conditions, ions do not pass through the silicon nitride film 8 having a thickness of about 50 nm on the polycrystalline silicon film 7a. Thus, boron is prevented from being implanted into the polycrystalline silicon film 7a. Boron is one example of a second impurity.

Figure 12:
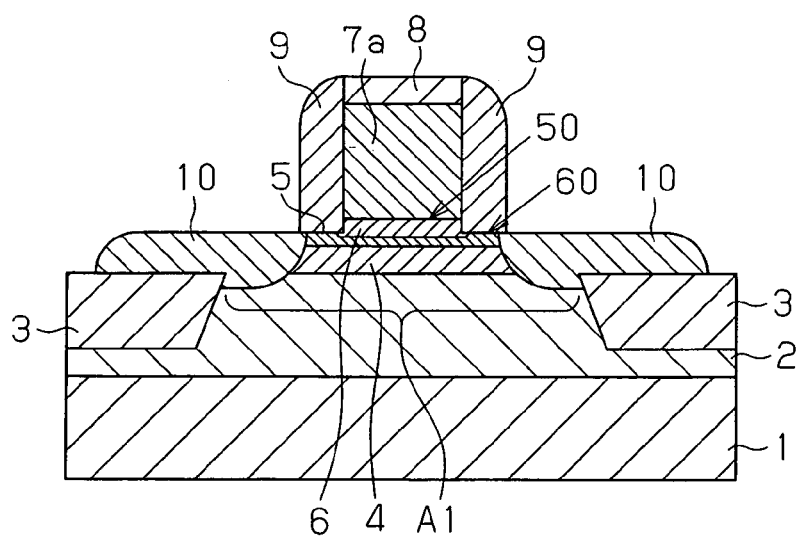

[Process 8: FIG. 12]

Then, heat treatment is performed to diffuse the n-type impurity of the polycrystalline silicon film 7a into the silicon film 5 to form an n-type diffusion layer 6. As a result, an emitter-base junction is formed in the silicon film 5. Heat treatment is performed at 1050° C. for about 5 to 30 seconds using an RTA (rapid thermal annealing) apparatus.

The emitter layer (n-type diffusion layer 6) in the silicon film 5 is formed by diffusing the n-type impurity from the polycrystalline silicon film 7a. The diffusion normally occurs not only in the depthwise direction but also in the lateral direction of the layer. The effective emitter width may become greater than the width of the polycrystalline silicon film 7a. However, in the first embodiment of the present invention, the contact surface 50 of the emitter layer (n-type diffusion layer 6) and the emitter electrode (polycrystalline silicon film 7a) is higher than the lower surface 60 of the side wall film 9. Thus, the side wall film 9 functions as a diffusion barrier and regulates diffusion of the impurity in the lateral direction of the n-type diffusion layer 6. As a result, the width of the emitter layer is reduced.

Figure 13:
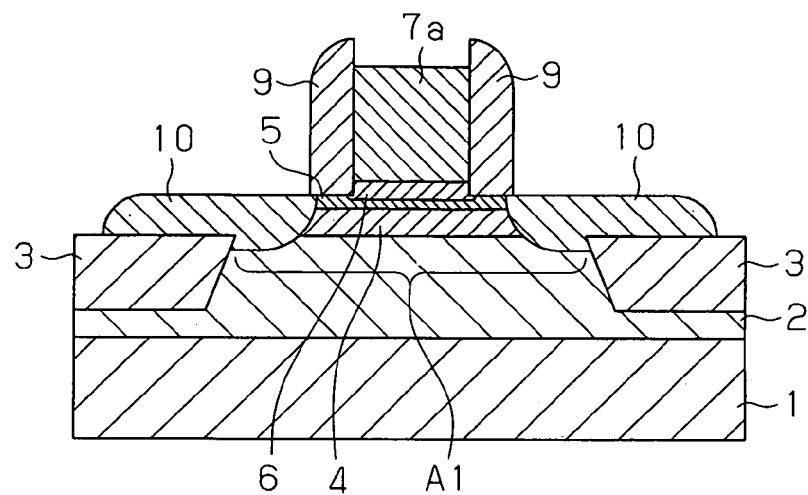

[Process 9: FIG. 13]

After the heat treatment, the silicon nitride film 8 on the base electrode (not shown), the emitter electrode, and the collector electrode (not shown) is removed using diluted hydrofluoric acid and phosphoric acid. Part of the surface of the p$^+$ diffusion layer 10 (silicon film 5) is removed by performing dry etching. The etching damages (damage layers) formed on the surfaces 80a and 80b of the silicon film 5 in processes 5 and 6 are removed. The dry etching may be performed, for example, under the conditions in which the pressure: 166 Pa (1250 mT); the gas flow rate $O_2/CF_4$: 200/100 ml/minute (sccm); and the RF power: 450 W. The dry etching conditions are determined in a manner that the etching damage on the p$^+$ diffusion layer 10 (silicon film 5) is smaller than the etching damage caused by the dry etching performed under the conditions used in processes 5 and 6. It is preferable that this dry etching be controlled to remove the p$^+$ diffusion layer 10 by a depth of, for example, about 10 nm. In other words, it is preferable that the dry etching be controlled to remove the surface layer of the p$^+$ diffusion layer 10 (silicon film 5) by a thickness of, for example, about 10 nm.

The etching damage (damaged layer) on the surface 80a of the silicon film 5 may be removed after process 5, or the etching damage (damaged layer) on the surface 80b of the silicon film 5 may be removed after the dry etching performed in process 6. However, when the etching damage (damaged layer) removal is performed whenever the silicon film 5 is damaged by etching, the reduced amount of the film thickness of the silicon film 5 (total removed thickness) in the etching damage removal may be too large. For example, the silicon film 5 may be completely removed at certain positions thereby partially exposing the SiGe alloy layer 4. In this case, silicide film formation may be inhibited at the exposed positions of the SiGe alloy layer 4. As a result, the formed silicide film formed may not have a uniform film quality and a uniform film thickness. It is preferable that the etching damage (damaged layer) removal be performed after the last one of the processes in which the silicon film 5 is damaged by etching. It is further preferable that the etching damage removal be performed only-once to remove all etching damages together in a period from completion of the last process in which the silicon film 5 is damaged by etching to immediately before a silicide film formation process (process 12 below) is started.

[Process 10: FIG. 3]

Layers of cobalt (Co) are formed on the surface of the polycrystalline silicon film 7a and the surface of the $p^+$ diffusion layer 10. Then, heat treatment is performed to form cobalt silicide films (silicide films) 11a and 11b. The sheet resistance of the silicide films 11a and 11b is about 7 $\Omega/\square$ (square), which is much lower than the sheet resistance of 100 $\Omega/\square$ of the conventional $p^+$-type SiGe layer ($p^+$ diffusion layer 10). Thus, the parasitic resistance generated between the internal base layer and a base electrode (not shown) connected to the external base layer is reduced.

In the silicide film formation process, layers of titanium (Ti) may be formed instead of the cobalt layers to form titan silicide films. The same advantages are obtained in this case.

Next, although not shown in the drawings, an inter-layer insulative film, such as a plasma TEOS film, is formed on the surface of the semiconductor substrate by performing deposition. Openings for contacts are formed in the collector electrode, the base electrode, and the emitter electrode of an NPN transistor. Further, a barrier metal layer made of titanium or the like and a conductive layer made of aluminum or an aluminum alloy are formed. This completes the manufacture of the bipolar transistor having an NPN transistor.

Figure 1:
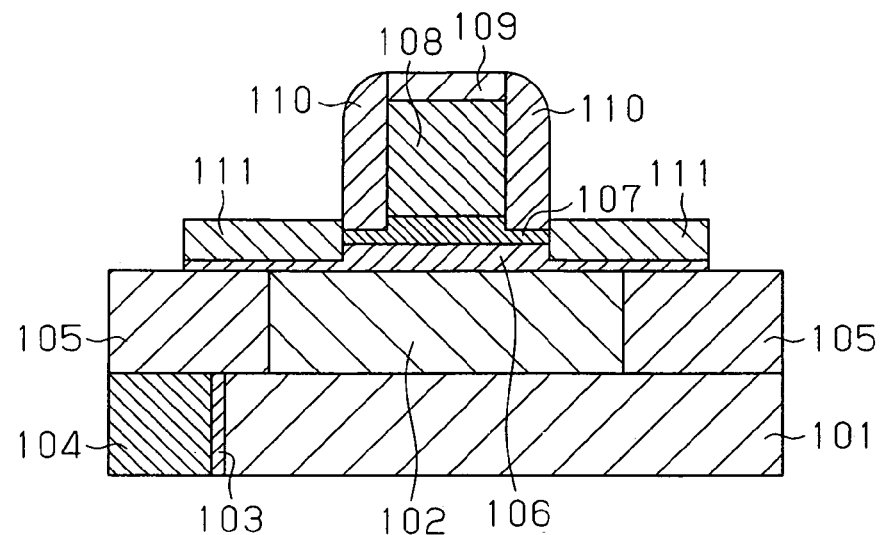
FIG. 1 is a cross-sectional view of a conventional heterojunction bipolar transistor including a SiGe alloy base layer.
Figure 2:
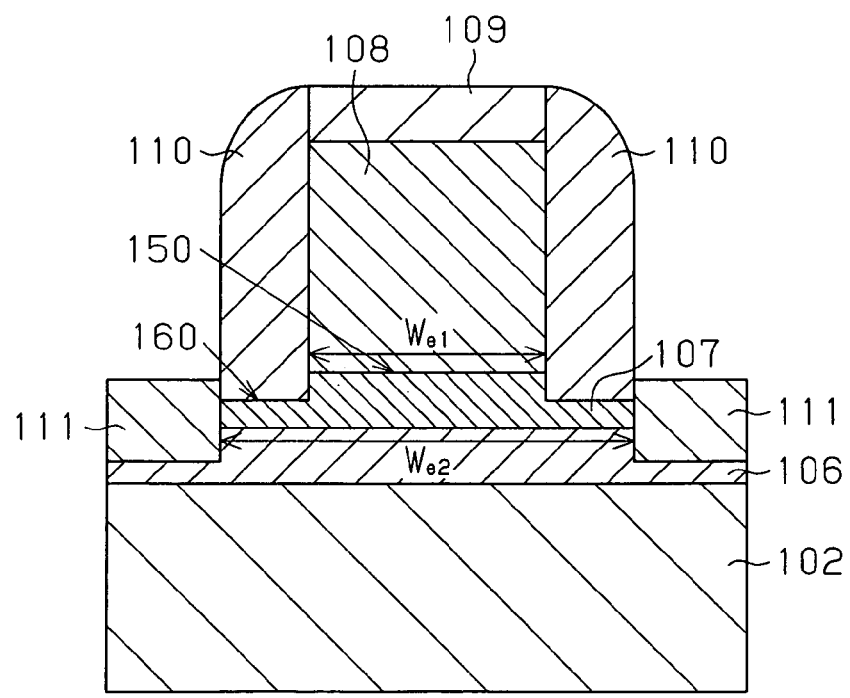
FIG. 2 is a partially enlarged view of the bipolar transistor of FIG. 1.

As shown in FIG. 2, the width of the conventional emitter-base junction portion is $W_{e2}$. However, in the first embodiment of the present invention, the silicon film processed to have the same dimensions as in the conventional structure internally has the first region and the second region. The first region of the silicon film is selectively used as an emitter layer. An emitter-base junction is formed in a bottom portion of this emitter layer. Thus, the width of the emitter-base junction portion is $W_{e3}$. In this manner, the width of the boundary surface between the silicon film and the SiGe alloy layer (width $W_{e2}$ in the conventional structure) is further reduced. The width of the junction portion of the emitter layer is substantially controlled to be equal to the width $W_{e1}$ by controlling diffusion of the n-type impurity to the silicon film 5. As a result, the width of the emitter layer is reduced without requiring the procurement and use of a high precision exposure apparatus. When the width of the emitter layer is reduced, that is, when the junction portion width becomes equal to $W_{e3}$ or $W_{e1}$, the structure achieves the same current density using a smaller current as compared with when the width of the boundary surface between the silicon film and the SiGe alloy layer is $W_{e2}$. This enables the transistor to have lower consumption power, and consequently enables the semiconductor device to have higher performance.

In the first embodiment, the silicon film 5 is at least partially positioned between the SiGe alloy layer 4 and the side wall film 9 and in contact with both the SiGe alloy layer 4 and the side wall film 9. This enables the emitter-base junction area to be smaller than the emitter-base junction area in the conventional structure (in which the silicon film 5 also functions as an emitter layer). Thus, the transistor (semiconductor device) has a smaller junction area and a smaller junction capacity than the conventional structure.

The second region of the silicon film 5 is at least partially positioned between the SiGe alloy layer 4 and the side wall film 9 to prevent the SiGe alloy layer 4 and the side wall film 9 from coming into direct contact with each other. Thus, the base current is prevented from re-coupling at the boundary of the SiGe alloy layer 4 and the side wall film 9. This method enables manufacture of the semiconductor device having a satisfactory base current characteristic.

After process 8 (FIG. 12), process 10 (FIG. 14) in which a silicide film is formed on the surface of the $p^+$ diffusion layer 10 is performed. However, it is preferable that process 9 (FIG. 13) for removing the damaged layer on the surface of the $p^+$ diffusion layer 10 be performed at least before process 10. When a silicide film is formed on the surface of the $p^+$ diffusion layer 10 with the etching damage (damaged layer), the film quality of the silicide film may deteriorate or the shape of the silicide film may change at its positions corresponding to the etching damage (damaged layer). The silicide film with such film quality change or shape change may increase its wiring resistance. However, with the manufacturing method of the present invention, the silicide film is formed on the surface of the $p^+$ diffusion layer 10 (silicon film 5) on which the etching damage (damaged layer) has been removed. As a result, the silicide film formed on the $p^+$ diffusion layer 10 has an improved film quality, and the silicide film has a reduced wiring resistance.

In particular, it is preferable that process 9 for removing the etching damage (damaged layer) on the surface of the $p^+$ diffusion layer 10 (silicon film 5) be performed only once to remove all etching damages together immediately before the silicide film formation process. In this case, the number of the manufacturing processes is reduced and the manufacturing cost is reduced, and further the reduced thickness of the $p^+$ diffusion layer 10 (silicon film 5) through the etching damage (damaged layer) removal is minimized. This eliminates the need for forming a thick silicon film 5, and enables a desired $p^+$ diffusion layer 10 to be formed even when the silicon film 5 is thin. This further reduces the manufacturing cost. Thus, the semiconductor device has higher performance and is manufactured at a lower cost.

Table 1 shows the measurement results of the sheet resistance of silicide films formed under various conditions. The conditions include: (1) a silicide film is formed on a silicon film after damage on the silicon film is removed, (2) a silicide film is formed on a silicon film without removing damage on the silicon film, and (3) a silicide film is formed on a silicon film that is not damaged. The results shown in Table 1 indicate that the sheet resistance of the silicide film formed on the damaged surface of the silicon film is drastically high. The damage removal recovers the sheet resistance of the silicide film to substantially the same level as before the silicon film is damaged.

TABLE 1

| Condition | Silicon Film Damaged | Damage Removal | Sheet resistance ($\Omega$/square) |
| --- | --- | --- | --- |
| (1) | YES | YES | 6.9 |
| (2) | YES | NO | 991.6 |
| (3) | NO | NO | 7.4 |

Figure 14:
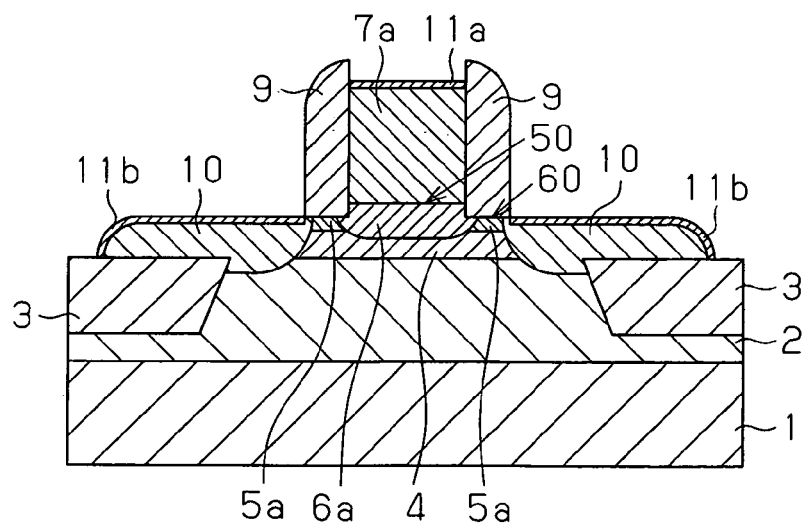
FIG. 14 is a cross-sectional view of a semiconductor device according to a second embodiment of the present invention.

FIG. 14 is a cross-sectional view showing elements of a heterojunction bipolar transistor including a SiGe base layer according to a second embodiment of the present invention. The second embodiment differs from the first embodiment in that a lower surface of an n-type diffusion layer 6a is positioned in a SiGe alloy layer 4. A silicon film 5a is one example of the second region. The n-type diffusion layer 6a is one example of the first region.

The lower surface of the n-type diffusion layer 6a is positioned in the SiGe alloy layer 4. In this case, the distance between the lower surface of the n-type diffusion layer 6a functioning as an emitter layer and a collector layer 2 is shorter than when the lower surface of the n-type diffusion layer is not positioned in the SiGe alloy layer 4. The shorter distance between the lower surface of the n-type diffusion layer 6a and the collector layer 2 shortens the time taken by electrons to travel from the emitter layer side to the collector layer. This enables the transistor to operate at higher speeds. As a result, the semiconductor device has higher performance.

To manufacture the semiconductor device of the second embodiment, a silicon film 5a having a thickness of about 30 nm is formed by performing low-pressure CVD in process 2 of the first embodiment, and the heat treatment is performed at about 1050° C. for about 5 seconds using an RTA apparatus in process 8. As a result, an n-type impurity of a polycrystalline silicon film 7a is diffused by about 40 nm toward the collector layer 2 so that the n-type impurity passes through the silicon film 5a, which has a thickness of about 30 nm, and enters the SiGe alloy layer 4. In this case, the emitter injection efficiency is higher and the current amplification factor is higher as compared with when the lower surface of the n-type diffusion layer 6a (emitter-base junction portion) is not positioned in the SiGe alloy layer 4 (when the lower surface of the n-type diffusion layer 6a is positioned in the silicon film 5a). This is because the band gap of the SiGe alloy layer is narrower than the band gap of the silicon film when the lower surface of the n-type diffusion layer 6a is positioned in the SiGe alloy layer 4 and the barrier against electrons injected from the emitter layer into the base layer is lower as compared with when the lower surface of the n-type diffusion layer 6a is positioned in the silicon film 5a. In this case, the barrier against electrons injected from the emitter layer into the base layer is lower than the barrier against positive holes injected from the base layer into the emitter layer. As a result, the emitter injection efficiency is higher, and the current amplification factor is higher. This enables the semiconductor device to have higher performance.

A semiconductor device according to a third embodiment of the present invention will now be described with reference to FIGS. 15 and 16.

Figure 15:
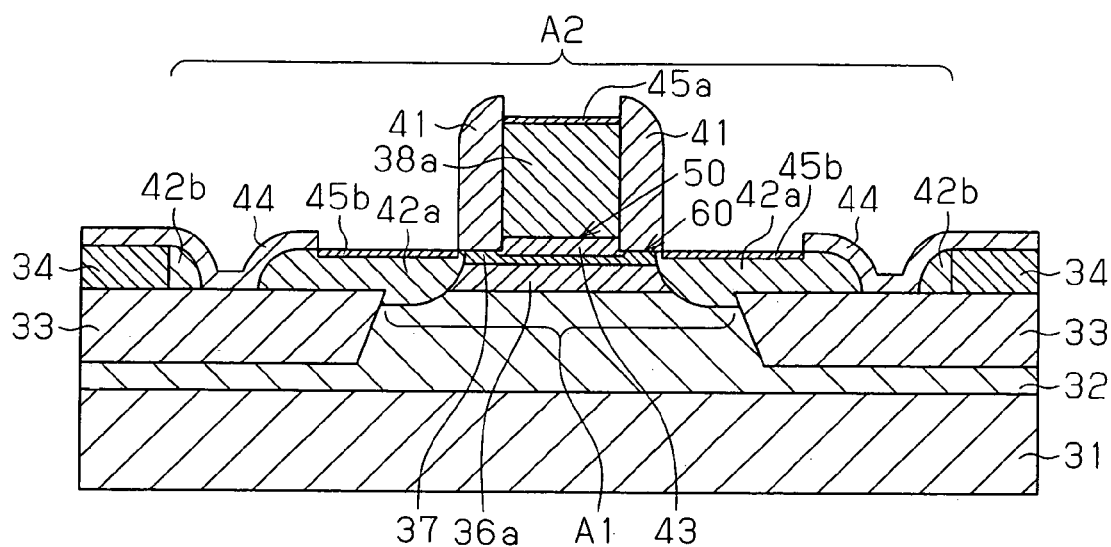
FIG. 15 is a cross-sectional view of a semiconductor device according to a third embodiment of the present invention.
Figure 16:
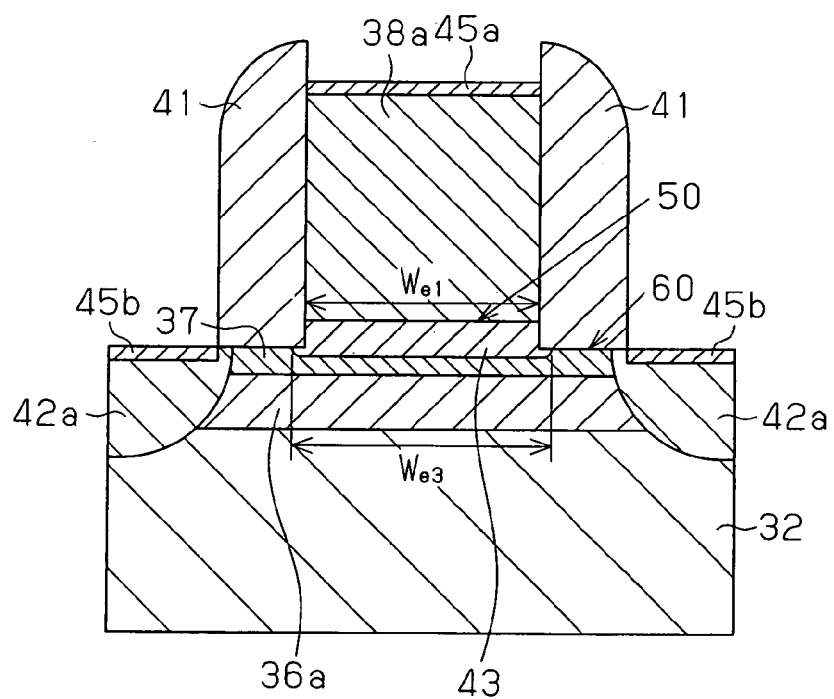
FIG. 16 is a partially enlarged view of the semiconductor device of FIG. 15.

In FIG. 15, an epitaxial layer 32, which is used as a collector layer, is formed on a p-type silicon substrate 31, which functions as a semiconductor substrate, and an isolation film 33 having the STI structure is formed on part of the epitaxial layer 32. Part of the epitaxial layer 32 surrounded by the isolation film 33 functions as an active region A1. A protective film 34, which is made of a silicon oxide film and has an opening A2, is arranged on the isolation film 33. At least the surface of the active region A1 is arranged within the opening A2 of the protective film 34. In other words, the protective film 34 is not arranged on the active region A1. An SiGe alloy layer 36a, which is used as a base region, is formed on the active region A1 arranged within the opening A2 of the protective film 34. A silicon film 37 and an n-type diffusion layer 43 are formed on the SiGe alloy layer 36a. The n-type diffusion layer 43 is used as an emitter layer. The n-type diffusion layer 43 is formed by diffusing an n-type impurity on a projection 70 (refer to FIG. 23) of the silicon film 37. The silicon film 37 prior to the diffusion of the n-type impurity has a reverse T-shaped cross-section. On the n-type diffusion layer 43, a polycrystalline silicon film 38a and a silicide film 45a are formed. The n-type diffusion layer 43, the polycrystalline silicon film 38a, and the silicide film 45a are surrounded by a side wall film 41, which is formed by an insulative film. A contact surface 50 between the n-type diffusion layer 43 and the polycrystalline silicon film 38a is higher than a lower surface 60 of the side wall film 41. Part of the silicon film 37 is positioned between the side wall film 41, which is formed by an insulative film, and the SiGe alloy layer 36a and is in contact with both the side wall film 41 and the SiGe alloy layer 36a. A $p^+$ diffusion layer 42a, which is connected to the base region, surrounds the silicon film 37. The $p^+$ diffusion layer 42a is partially covered by the protective film 34, which is made of a silicon oxide film having an opening. More specifically, the $p^+$ diffusion layer 42a has a surface exposed from the protective film 34. A silicide film 45b, which is used as a low-resistance layer of an external base layer, is formed on the exposed surface of the $p^+$ diffusion layer 42a.

In the present invention, a conductive layer includes a semiconductor layer containing a p-type or n-type impurity to obtain conductivity. The SiGe alloy layer 36a is one example of the conductive layer. The silicon film 37 is one example of the second region. The n-type diffusion layer 43 is one example of the first region. The polycrystalline silicon film 38a is one example of an emitter electrode. The $p^+$ diffusion layer 42a is one example of the impurity region.

As shown in FIG. 2, the width of the conventional emitter-base junction portion is $W_{e2}$. However, in the third embodiment of the present invention, the silicon film processed to have the same dimensions as in the conventional structure internally has the first region and the second region as shown in FIG. 16. The first region of the silicon film is selectively used as an emitter layer. An emitter-base junction is formed in a bottom portion of this emitter layer. Thus, the width of the emitter-base junction portion is $W_{e3}$. In this manner, the width of the contact surface or the boundary surface between the silicon film and the SiGe alloy layer (width $W_{e2}$ in the conventional structure) is further reduced. The width of the junction portion of the emitter layer is substantially controlled to be equal to width $W_{e1}$ by controlling diffusion of the n-type impurity to the silicon film 37. As a result, the width of the emitter layer is reduced without requiring procurement and use of a high precision exposure apparatus. When the width of the emitter layer is reduced, that is, when the junction portion width becomes the $W_{e3}$ or $W_{e1}$, the structure achieves the same current density using a smaller current as compared with when the width of the boundary surface between the silicon film and the SiGe alloy layer is $W_{e2}$. This enables the transistor to have lower consumption power, and consequently enables the semiconductor device to have higher performance.

In the third embodiment, at least part of the silicon film 37 is positioned between the SiGe alloy layer 36a and the side wall film 41 and is in contact with both the SiGe alloy layer 36a and the side wall film 41. This enables the emitter-base junction area to be smaller than the emitter-base junction area in the conventional structure (in which the silicon film 37 also functions as an emitter layer). Thus, the transistor (semiconductor device) has a smaller junction area than the conventional structure and accordingly has a smaller junction capacity.

A processes for manufacturing the semiconductor device of the third embodiment will now be described with reference to FIGS. 17 to 29.

Figure 17:
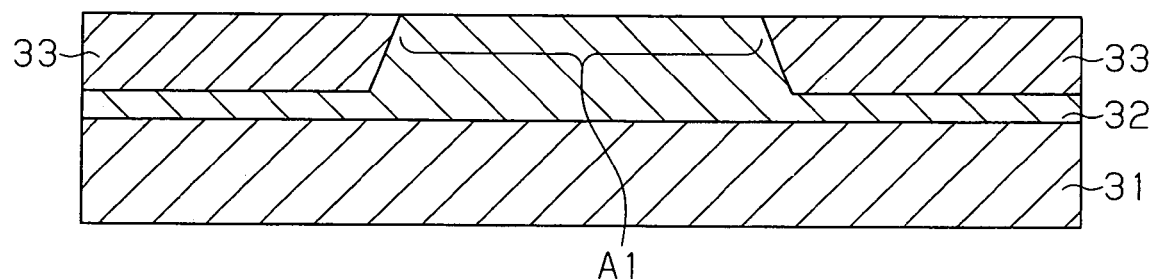
FIGS. 17 to 29 are cross-sectional views describing a manufacturing method for the semiconductor device of FIG. 15.

[Process 1: FIG. 17]

An isolation film 33 having the STI structure or the like is formed on a p-type silicon substrate 31. Then, an n-type impurity is ion-implanted and activated to form a collector layer 32 including an active region A1. For example, phosphorus is implanted with electron acceleration energy in a range of about 500 to 4000 keV to have a concentration in a range of about $3\times10^{13}$ to $3\times10^{15}$ cm$^{-2}$. After the implantation, the structure is subjected to heat treatment of about 1000° C. The collector layer 32 may be formed by implanting arsenic at an electron acceleration energy in a range of about 50 to 200 keV to have a concentration in a range of about $1\times10^{15}$ to $1\times10^{16}$ cm$^{-2}$, and a silicon epitaxial layer doped to have an n-type may be grown on the collector layer 32, and then the isolation film 33 having the STI structure may be formed.

Figure 18:
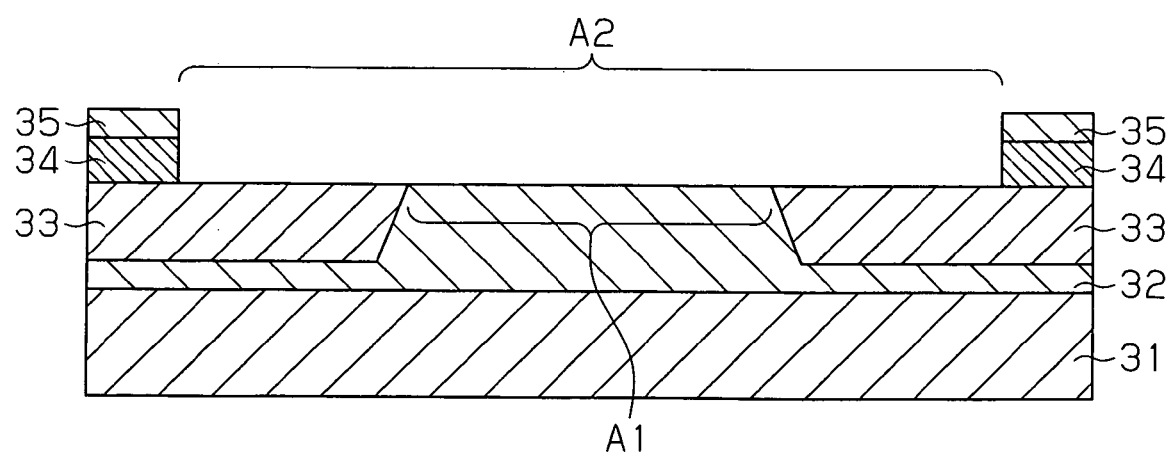

[Process 2: FIG. 18]

A silicon oxide film 34, which functions as a protective film, and a polycrystalline silicon film 35 are formed by performing low-pressure CVD with each having a thickness of about 50 nm. A resist pattern is formed by performing lithography. Unnecessary portions of the polycrystalline silicon film 35 are removed by performing dry etching. Then, unnecessary portions of the silicon oxide film 34 are removed by performing wet etching. As a result, the silicon oxide film 34 and the polycrystalline silicon film 35, each having a predetermined opening A2, which defines a bipolar transistor formation region or pit, including the active region A1, are formed on the isolation film 33.

Figure 19:
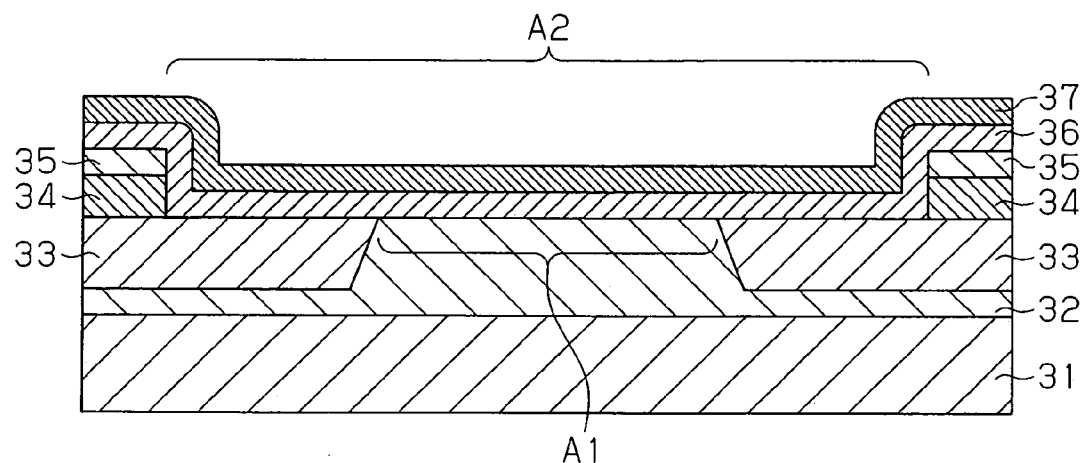

[Process 3: FIG. 19]

A silicon-germanium (SiGe) alloy layer 36, which is doped with boron at a concentration of about $1\times10^{19}$ cm$^{-3}$, and a silicon film 37 that does not contain germanium (Ge) are epitaxially grown by performing low-pressure CVD. The thickness of each of the SiGe alloy layer 36 and the silicon film 37 is preferably controlled to be about 40 nm, that is, about 80 nm in total. The SiGe alloy layer 36 and the silicon film 37 are conformally coated on the opening edges of the silicon oxide film 34 and the polycrystalline silicon film 35. The SiGe alloy layer 36 is epitaxially grown to have the same lattice parameter as the semiconductor substrate (p-type silicon substrate 31). The silicon film 37 formed on the SiGe alloy layer 36 also reflects the lattice parameter of the SiGe alloy layer 36.

The concentration of Ge in the SiGe alloy layer 36 may be uniform throughout the entire layer. Alternatively, the SiGe alloy layer 36 may have a gradient Ge concentration profile that gradually increases the Ge concentration from the side in contact with the silicon film 37 toward the active region A1 (the collector layer 32). Such a gradient Ge concentration profile shortens the time taken by electrons to travel through a base layer and enables the transistor to operate at higher speeds. In this case, it is preferable that the Ge concentration be substantially about 0% at the side in contact with the silicon film 37 and about 15 to 20% at the side in contact with the collector layer 32.

The silicon film 37 may also be doped with boron in the same manner as the SiGe alloy layer 36 but does not have to be doped with boron.

Before the SiGe alloy layer 36 is formed, a silicon film that does not contain boron or a SiGe alloy layer that does not contain boron may be epitaxially grown by performing low-pressure CVD.

Figure 20:
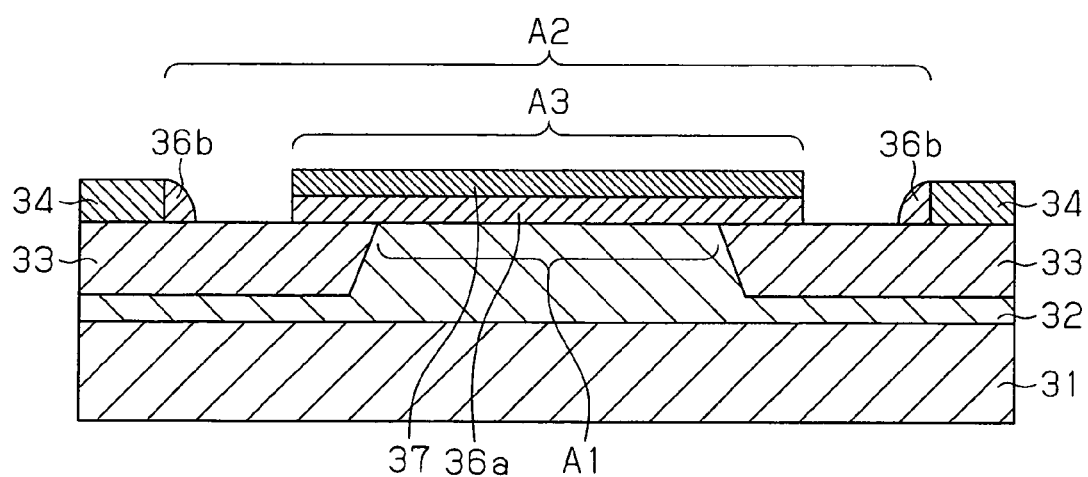

[Process 4: FIG. 20]

A resist pattern is formed by performing lithography. Unnecessary portions of the silicon film 37 and the SiGe alloy layer 36 are removed by performing dry etching. In this case, the polycrystalline silicon film 35 is also removed by etching. As a result, a SiGe alloy layer 36a that is used as a base region and a silicon film 37 are formed to have a predetermined pattern A3 within the bipolar transistor formation region A2. The dry etching may be performed, for example, under conditions in which the pressure: 2.0 Pa (15 mT); the gas flow rate O$_2$/HBr: 2/180 ml/minute (sccm); and the RF power Upper/Lower: 250 W/12 W. An SiGe alloy layer 36b, which functions as a spacer, is formed on a side surface (opening edge) of the silicon oxide film 34.

Figure 21:
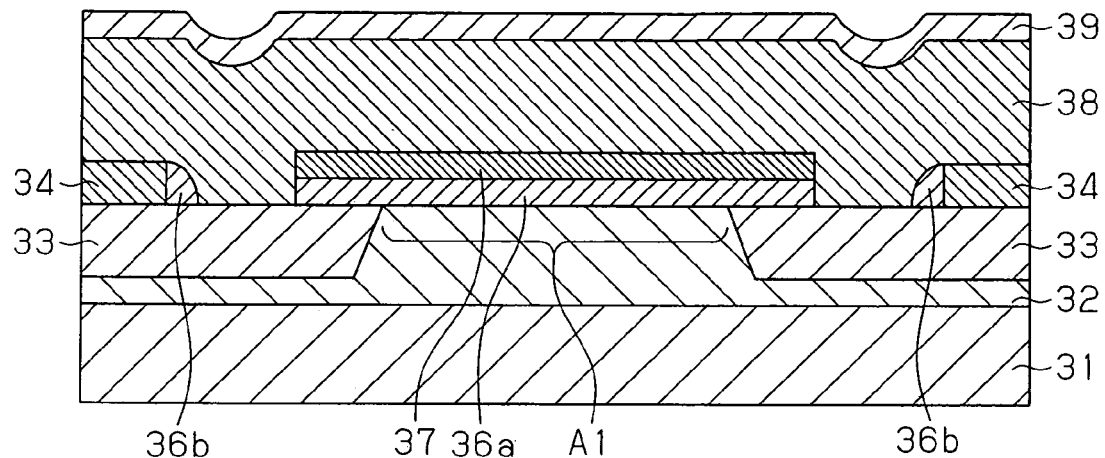

[Process 5: FIG. 21]

A polycrystalline silicon film 38, which is doped with an n-type impurity at a concentration of about $1\times10^{20}$ cm$^{-3}$ or more, is formed by performing low-pressure CVD. A silicon nitride film 39 is formed on the polycrystalline silicon film 38. Arsenic or phosphorus may be used as the n-type impurity. The thickness of the polycrystalline silicon film 38 is preferably controlled to be about 200 nm. The thickness of the silicon nitride film 39 is preferably controlled to be about 50 nm. The n-type impurity is one example of the first impurity.

Figure 22:
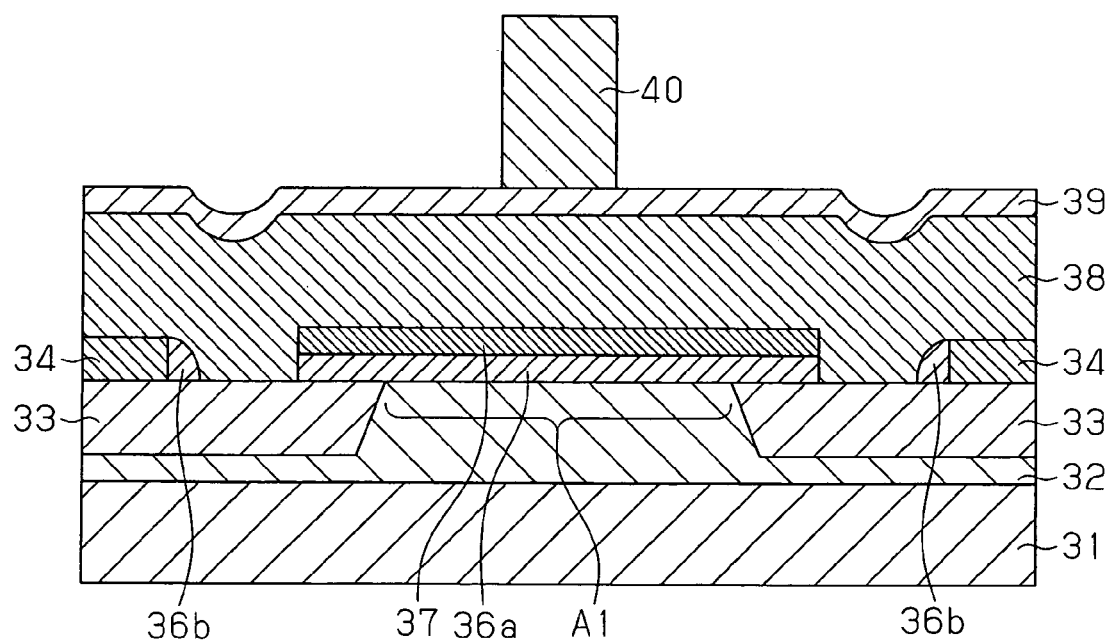

[Process 6: FIG. 22]

A resist pattern 40 for forming a desired emitter electrode is formed within the bipolar transistor formation region A2 by performing lithography.

Figure 31:
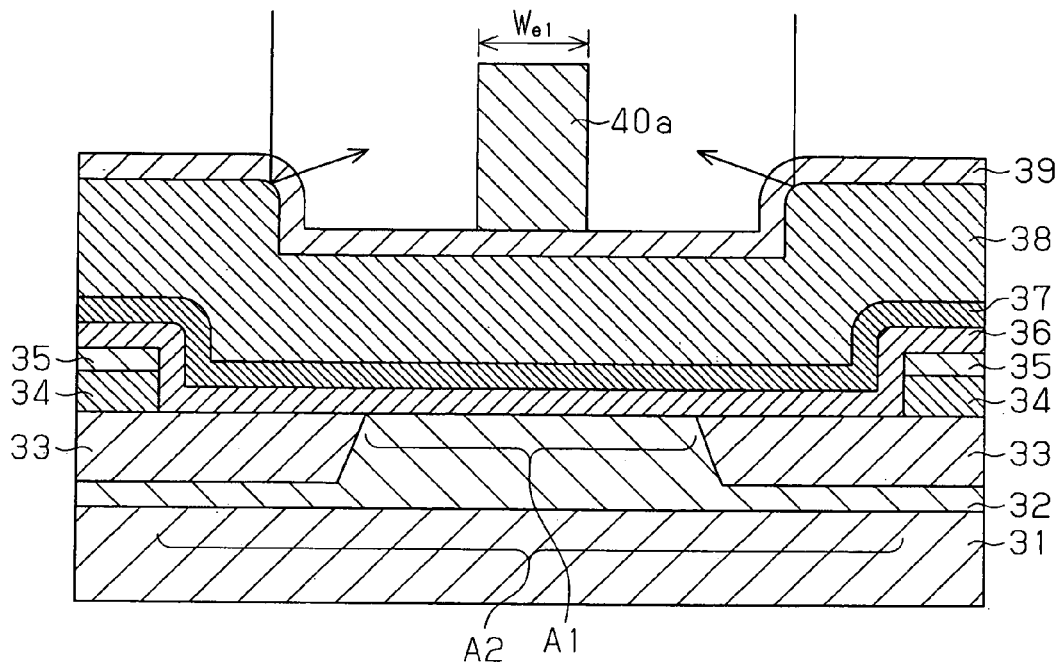
FIG. 31 is a cross-sectional view of a semiconductor device according to a comparative example of the manufacturing process corresponding to FIG. 22.

The SiGe alloy layer 36a and the silicon film 37 are formed only in the bipolar transistor formation region A2. More specifically, the SiGe alloy layer 36a and the silicon film 37 do not have portions extending over the silicon oxide film 34 unlike in the comparative example shown in FIG. 31 in which the SiGe alloy layer 36 and the silicon film 37 are extending over the silicon oxide film 34. In the third embodiment, the height of a portion of the polycrystalline silicon film 38 formed on the silicon oxide film 34 is lowered by an amount corresponding to the thickness of the SiGe alloy layer 36a and the silicon film 37, compared to the comparative example of FIG. 31. In other words, the upper surface of the polycrystalline silicon film 38 formed on the silicon oxide film 34 is located at substantially the same level of the upper surface of a portion of the polycrystalline silicon film 38 formed in the bipolar transistor formation region A2. This reduces diffusion of exposure light caused by a portion of the polycrystalline silicon film 38 extending over the silicon oxide film 34 (distal portion of the silicon oxide film 34), and prevents deformation or shape change of the resist pattern 40 caused by such diffused exposure light. In the comparative example of FIG. 31, the resist pattern 40a may be deformed by reflection or diffusion of exposure light for forming an emitter electrode 38.

Figure 23:
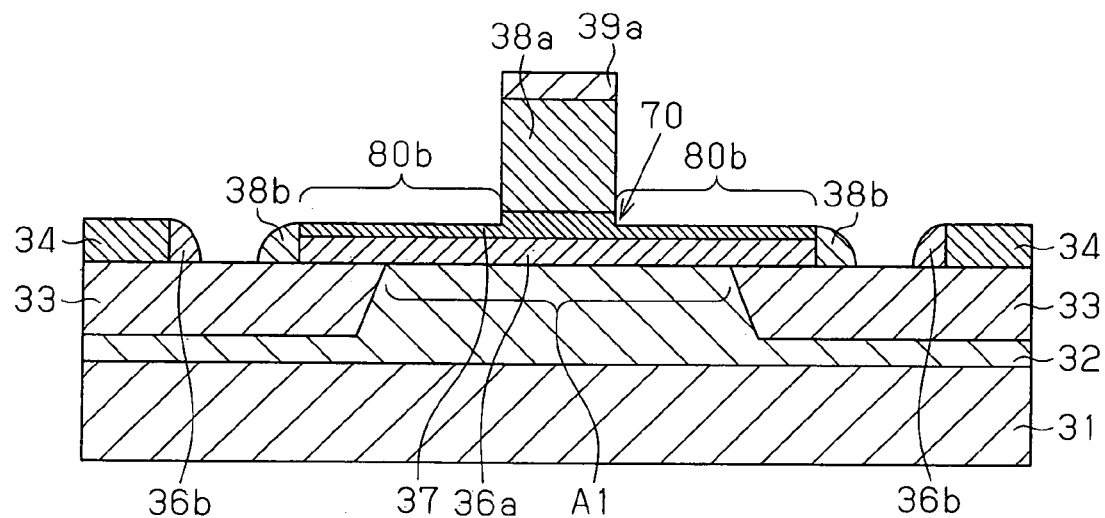

[Process 7: FIG. 23]

The silicon nitride film 39, the polycrystalline silicon film 38, and the silicon film 37 are removed by performing dry etching sequentially in the stated order. The dry etching is preferably controlled to process the silicon film 37 to be partially thin. More specifically, the dry etching is not continued until the silicon film 37 is removed completely and is stopped when the silicon film 37 still remains on the entire surface of the SiGe alloy layer 36a. As a result, the silicon film 37 is processed to have a reverse T-shaped cross-section with a projection 70. Further, a surface 80a of the silicon film 37 is damaged by the etching so that a damaged layer is formed on the surface 80a. The polycrystalline silicon film 38 is processed as a polycrystalline silicon film 38a, which functions as an emitter electrode, and as a side wall film 38b, which is formed by a polycrystalline silicon film and surrounds the SiGe alloy layer 36a and the silicon film 37. The silicon nitride film 39 is processed as a silicon nitride film 39a and functions as a mask when the polycrystalline silicon film 38 is etched. The dry etching may be performed, for example, under conditions in which the pressure: 2.0 Pa (15 mT); the gas flow rate O$_2$/HBr: 2/180 ml/minute (sccm); and the RF power Upper/Lower: 250 W/12 W.

The SiGe alloy layer 36a and the silicon film 37 are formed only in the bipolar transistor formation region A2. Thus, the SiGe alloy layer 36a and the silicon film 37 do not have portions-extending over the silicon oxide film 34 unlike in the comparative example shown in FIG. 31 in which the SiGe alloy layer 36a and the silicon film 37 are extend over the silicon oxide film 34. Thus, when continuing the dry etching of the polycrystalline silicon film 38, the silicon oxide film 34 is exposed at positions other than the bipolar transistor formation region A2 when the silicon film 37 is exposed. Although the etching control of different members made of the same material (the polycrystalline silicon film 38 and the silicon film 37 in the present embodiment) is normally difficult, the point at which the silicon oxide film 34 is exposed is controllable using end point control employed in normal dry etching. The point of time in which the silicon oxide film 34 is exposed is regarded as the point of time in which the silicon film 37 is exposed. In this way, the silicon film 37 is etched in a favorably controlled manner. This enables the silicon film 37 to be processed to have a reverse T-shaped cross-section with highly accurate repeatability.

Figure 24:
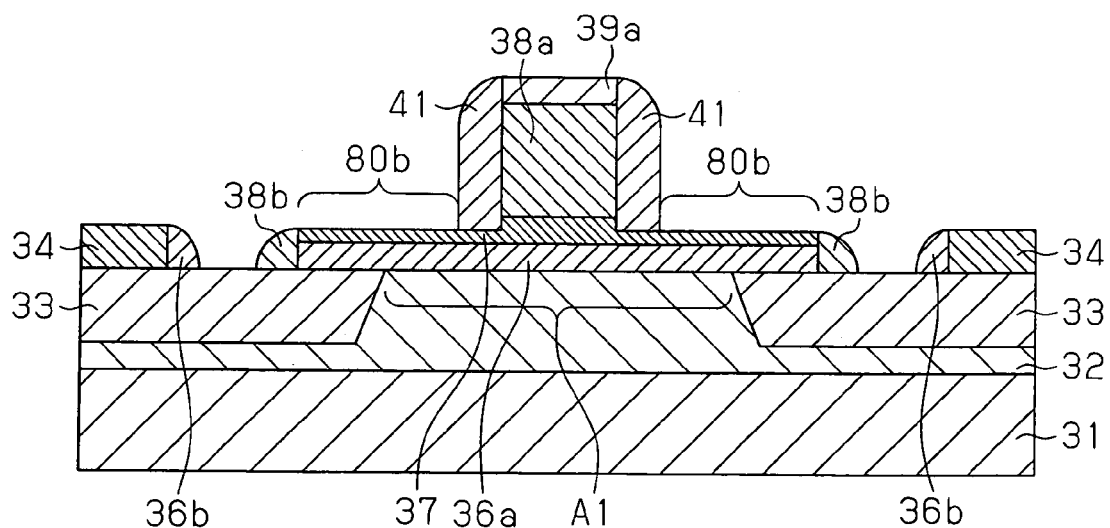

[Process 8: FIG. 24]

A silicon oxide film, which is an insulative film, is formed by performing CVD. Then, the entire film surface is etched back by performing dry etching so that a side wall film 41 formed by a silicon oxide film surrounds the silicon nitride film 39a, the polycrystalline silicon film 38a, and the projection 70 of the silicon film 37. A surface 80b of the silicon film 37 is further damaged by the dry etching so that a damaged layer is formed on the surface 80b. The silicon oxide film may be formed, for example, by heating a mixture of TEOS and $O_2$ at about 720° C. The thickness of the silicon oxide film is preferably about 200 nm. The dry etching may be performed, for example, under conditions in which the pressure: 33 Pa (250 mT); the gas flow rate $CHF_3/CF_4/Ar$: 20/20/400 ml/minute (sccm); and the RF power: 395 W.

Figure 25:
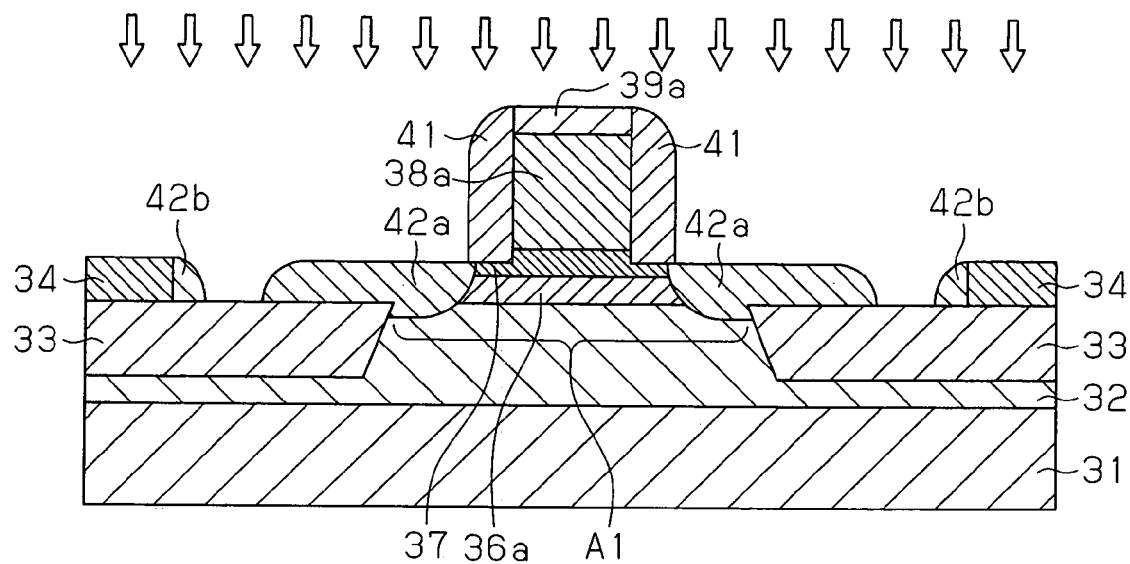

[Process 9: FIG. 25]

Boron is ion-implanted in the silicon oxide film by ion implantation. The structure is then subjected to heat treatment to cause activation in the film to form a p$^+$ diffusion layer 42a, which functions as an external base layer. In this state, the SiGe alloy layer 36b formed on a side surface (opening edge) of the silicon oxide film 34 is formed as a p$^+$ diffusion layer 42b. For example, $BF_2$ may be ion-implanted with electron acceleration energy in a range of about 1 to 40 keV to have a concentration in a range of $1\times10^{14}$ to $5\times10^{15}$ cm$^{-2}$. The boron ions implanted under such a condition do not pass through the silicon nitride film 39a having a thickness of about 50 nm, which is on the polycrystalline silicon film 38a. Thus, boron is prevented from being implanted into the polycrystalline silicon film 38a. Boron is one example of the second impurity.

Figure 26:
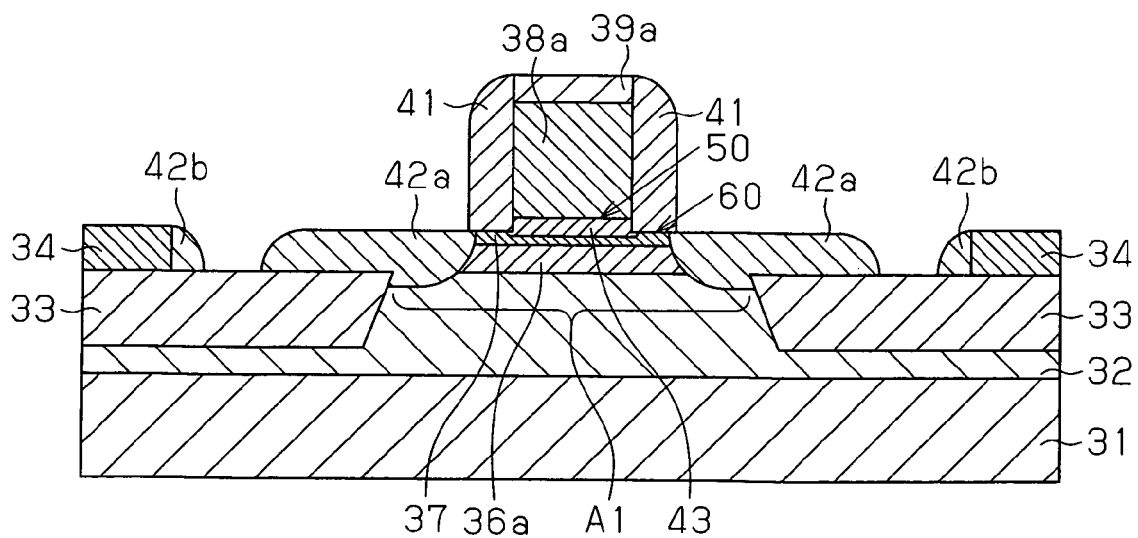

[Process 10: FIG. 26]

Heat treatment is performed to cause the n-type impurity in the polycrystalline silicon film 38a to diffuse into the silicon film 37 and form an n-type diffusion layer 43. As a result, an emitter-base junction is formed in the silicon film 37. The heat treatment is performed at about 1050° C. for about 5 to 30 seconds using an RTA apparatus.

The emitter layer (n-type diffusion layer) 43 formed in the silicon film 37 is formed by diffusing the n-type impurity from the polycrystalline silicon film 38a. The diffusion normally occurs not only in the depthwise direction but also in the lateral direction of the layer. The resulting effective emitter width may become wider than the width of the polycrystalline silicon film 38a. However, in the third embodiment of the present invention, the contact surface 50 of the emitter layer (n-type diffusion layer) 43 and the emitter electrode (polycrystalline silicon film) 38a is higher than the lower surface 60 of the side wall film 41. Thus, the side wall film 41 functions as a barrier for diffusion and regulates diffusion of the impurity in the lateral direction of the n-type diffusion layer 43. As a result, the width of the emitter layer is reduced.

Figure 27:
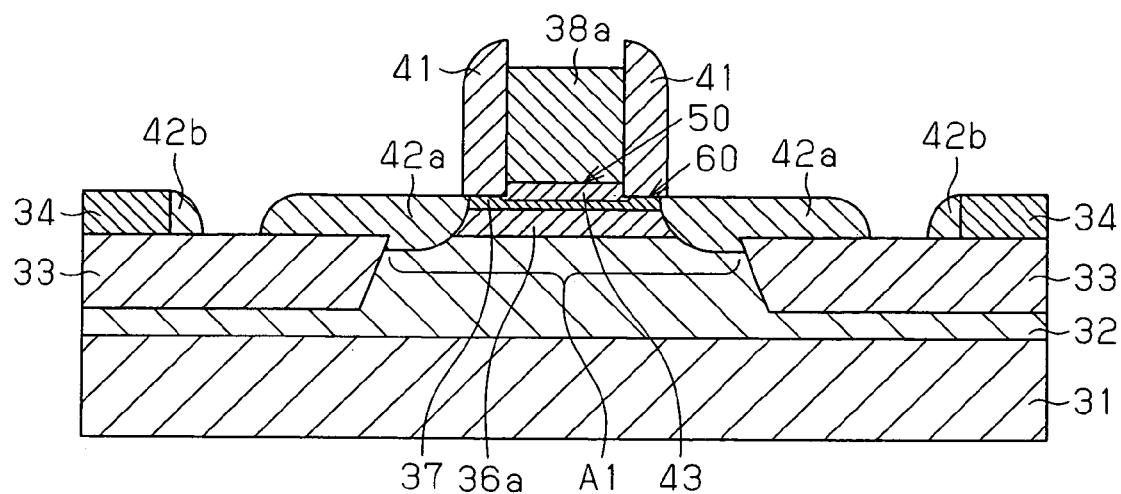

[Process 11: FIG. 27]

After the heat treatment, the silicon nitride film 39a on the base electrode (not shown), the emitter electrode, and the collector electrode (not shown) is removed using diluted hydrofluoric acid and phosphoric acid.

Figure 28:
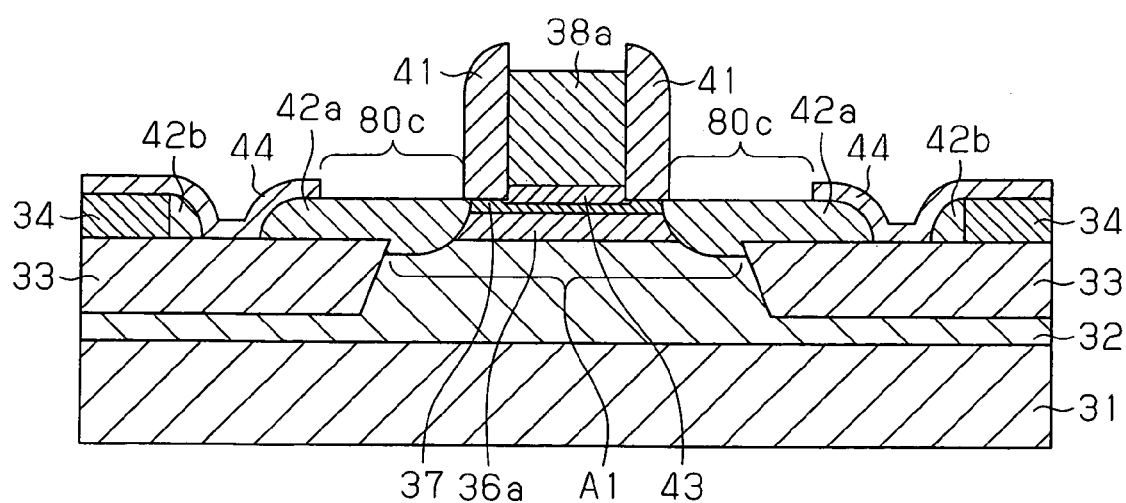

[Process 12: FIG. 28]

A silicon oxide film 44 is formed by performing CVD. Then, a resist pattern is formed by performing lithography, and unnecessary portions of the silicon oxide film 44 are removed by performing dry etching. As a result, the silicon oxide film 44 having an opening in a predetermined region and usable as a salicide (self-alignment silicide) block is formed. A surface 80c of the silicon film 37 is further damaged by the dry etching so that a damaged layer is formed on the surface 80c. The silicon oxide film 44 may be formed, for example, by heating a mixture of TEOS and $O_2$ at about 720° C. The thickness of the silicon oxide film 44 is preferably controlled to be about 50 nm. The dry etching may be performed, for example, under conditions in which the pressure: 33 Pa (250 mT); the gas flow rate $CHF_3/CF_4/Ar$: 20/20/400 ml/minute (sccm); and the RF power: 395 W.

Figure 29:
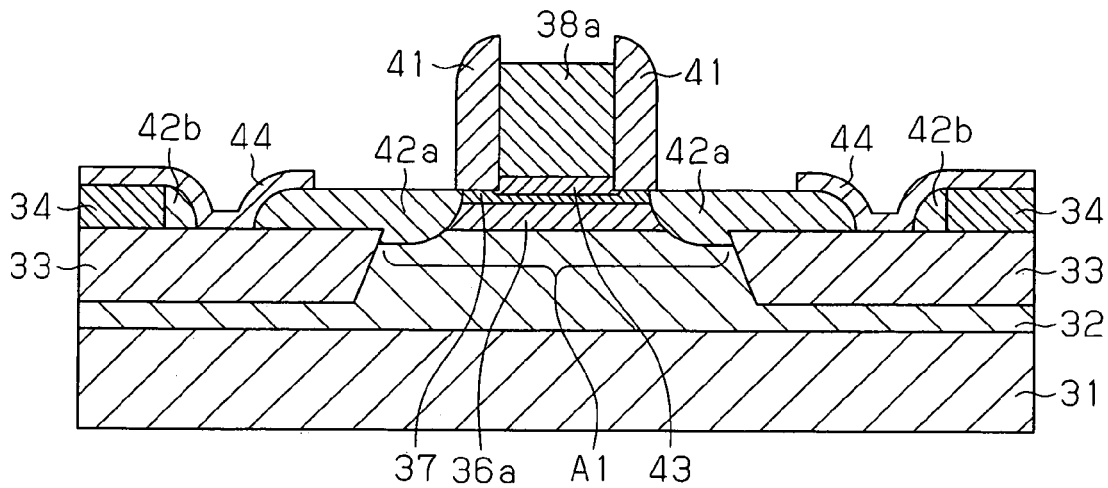

[Process 13: FIG. 29]

The surfaces 80a, 80b, and 80c of the silicon film 37 are damaged by performing etching through processes 7, 8, and 12, which are performed before process 13. In process 13, a surface portion of the p$^+$ diffusion layer 42 (silicon film 37) is removed by performing dry etching to remove the etching damages (damage layers) formed on the surfaces 80a, 80b, and 80c. The dry etching may be performed, for example, under conditions in which the pressure: 166 Pa (1250 mT); the gas flow rate $O_2/CF_4$: 200/100 ml/minute (sccm); and the RF power: 450 W. These dry etching conditions differ from the conditions used in processes 7, 8, and 12 and are determined in a manner that the etching damage on the p$^+$ diffusion layer 42 (silicon film 37) is small. It is preferable that the dry etching be controlled to remove the p$^+$ diffusion layer 42 (silicon film 37) by a depth of, for example, about 10 nm.

The etching damage (damaged layer) formed on the surface 80a of the silicon film 37 may be removed after the dry etching performed in process 7. Alternatively, the etching damage (damaged layer) formed on the surface 80b of the silicon film 37 may be removed after process 8. However, when the etching damage (damaged layer) removal is performed whenever each process is completed, the reduced amount of the film thickness of the silicon film 37 during the etching damage removal may be too large. For example, when the silicon film 37 is removed and the SiGe alloy layer 36a is exposed, silicide film formation may be inhibited at the exposed positions of the SiGe alloy layer 36a. As a result, the formed silicide film may not have a uniform film quality and a uniform-film thickness. It is preferable that the etching damage (damaged layer) removal be performed immediately before a silicide film formation process (process 14 described later) is started.

[Process 14: FIG. 15]

Layers of cobalt (Co) are formed on the surface of the polycrystalline silicon film 38a and the surface of the p$^+$ diffusion layer 42. Heat treatment is then performed to form cobalt silicide films (silicide films) 45a and 45b. The sheet resistance of the silicide films 45a and 45b is about 7 Ω/□, which is much lower than the sheet resistance of 100 Ω/□ of the conventional p$^+$-type SiGe layer (p$^+$ diffusion layer 42). Thus, the parasitic resistance generated between the internal base layer and a base electrode (not shown) connected to the external base layer is reduced.

In the silicide film formation process, layers of titanium may be formed instead of the cobalt layers to form titan silicide films. The same advantages are obtained in this case.

Next, although not shown in the drawings, an inter-layer insulative film, such as a plasma TEOS film, is formed on the surface of the semiconductor substrate through deposition, openings for contacts are formed in the collector electrode, the base electrode, and the emitter electrode of an NPN transistor, and a barrier metal layer made of, for example, titanium and a conductive layer made of aluminum or an aluminum alloy are formed. This completes the manufacture of the bipolar transistor having an NPN transistor.

The manufacturing method for the semiconductor device of the third embodiment has the advantages described below.

The width of the n-type diffusion layer 43, which functions as the emitter layer, is smaller than the width of the boundary surface between the silicon film 37 and the SiGe alloy layer 36a. In this case, the structure achieves the same current density using a smaller current as compared with when the width of the emitter layer is the same as the width of the boundary surface between the silicon film 37 and the SiGe alloy layer 36a. The current amplification factor is higher in this case. This enables the transistor to have lower consumption power. Further, at least part of the silicon film 37 is positioned between the SiGe alloy layer 36a and the side wall film 41 and is in contact with both the SiGe alloy layer 36a and the side wall film 41. This enables the emitter-base junction area to be smaller than the emitter-base junction area in the conventional structure (in which the silicon film 37 also functions as an emitter layer). Thus, the transistor has a smaller junction area and thereby has a smaller junction capacity than the conventional structure. As a result, the semiconductor device has higher performance.

With the manufacturing method of the third embodiment, at least part of the silicon film 37 is positioned between the SiGe alloy layer 36a and the side wall film 41, and the SiGe alloy layer 36a and the side wall film 41 do not directly contact each other. Thus, the base current is prevented from re-coupling at the boundary of the SiGe alloy layer 36a and the side wall film 41. This method enables manufacture of a semiconductor device having a satisfactory base current characteristic.

Further, in the diffusion of the first impurity in process 10 shown in FIG. 26, the contact surface 50 of the n-type diffusion layer 43 and the emitter electrode is higher than the lower surface 60 of the side wall film 41. Thus, the side wall film 41 functions as a barrier for diffusion of the first impurity and regulates diffusion of the first impurity in the lateral direction of the layer. As a result, the width of the n-type diffusion layer 43 is reduced further in a manner satisfactorily controlled manner.

In the manufacturing method of the third embodiment, the SiGe alloy layer 36a and the silicon film 37 are formed in the opening A2 of the protective film 34. In this case, the SiGe alloy layer 36a and the silicon film 37 do not have portions extending over the protective film 34. Thus, the thickness of the portion of the polycrystalline silicon film 38 formed on the protective film 34 is smaller than the thickness of the portion of the polycrystalline silicon film 38 formed in the opening A2 for an amount corresponding to the thickness of the SiGe alloy layer 36a and the silicon film 37. This reduces diffusion of exposure light (diffusion toward the resist pattern 40 for forming an emitter electrode. 38a) caused by a portion of the polycrystalline silicon film 38 extending over the silicon oxide film 34 (distal portion of the protective film 34) when the resist pattern 40 for processing the polycrystalline silicon film 38 as a desired emitter electrode 38a is formed. Further, deformation or shape change of the resist pattern 40 caused by such diffused exposure light is prevented. This enables the semiconductor device to have a stable performance.

In the manufacturing method of the third embodiment, the upper surface of the protective film 34 is preferably lower than the contact surface 50 of the n-type diffusion layer 43 and the emitter electrode 38a. In this case, the thickness of the portion of the polycrystalline silicon film 38 formed on the protective film 34 is smaller than the thickness of the portion of the polycrystalline silicon film 38 formed in the opening A2. This further reduces light diffused toward the resist pattern 40 for forming the emitter electrode 38a and more preferably prevents deformation or shape change of the resist pattern 40.

When a silicide film is formed on the surface of the $p^+$ diffusion layer 42a with the etching damage (damaged layer), the film quality of the silicide film may deteriorate or the shape of the silicide film may change at its positions corresponding to the etching damage (damaged layer). The silicide film with such film quality change or shape change may increase the wiring resistance. However, in the manufacturing method of the present invention, the silicide film is formed on the surface of the $p^+$ diffusion layer 42a (silicon film 37) on which the etching damage (damaged layer) has been removed. As a result, the silicide film formed on the $p^+$ diffusion layer 42a (silicon film 37) has an improved film quality, and the silicide film has a reduced wiring resistance. In particular, when the process for removing the etching damage (damaged layer) formed on the surface of the $p^+$ diffusion layer 42a is performed only once immediately before process 14, the number of the manufacturing processes is reduced and the manufacturing cost is reduced. Further, the reduced thickness of the $p^+$ diffusion layer 42a (silicon film 37) during the etching damage (damaged layer) removal is minimized. This eliminates the need for forming a thick silicon film 37, and permits a thin silicon film 37 to be formed. Further, the manufacturing cost of the semiconductor device is reduced.

In process 2 of the third embodiment, the silicon oxide film 34 and the polycrystalline silicon film 35 may be locally formed on a surface portion of the isolation film 33 excluding the active region A1 to form the opening A2.

Figure 30:
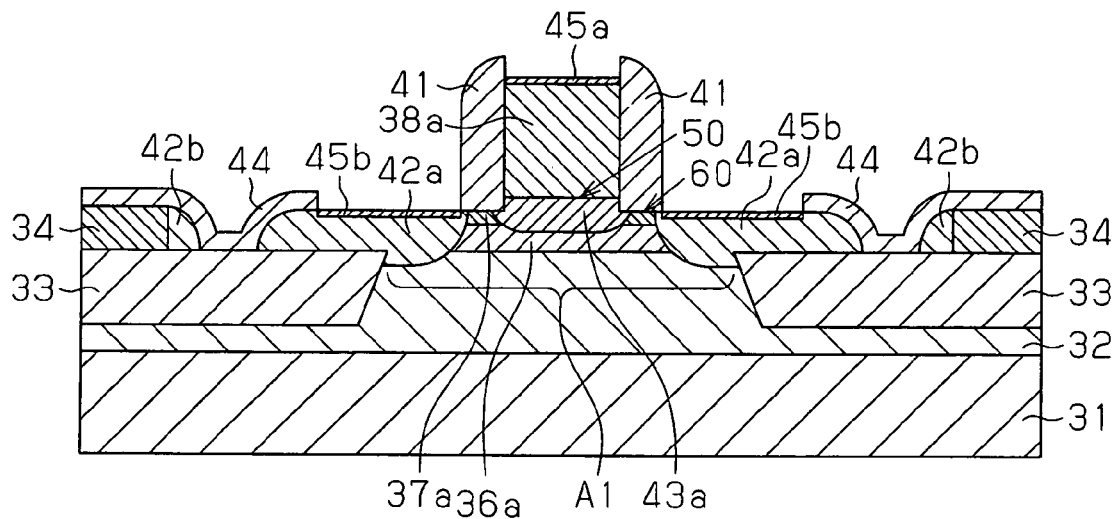
FIG. 30 is a cross-sectional view of a semiconductor device according to a fourth embodiment of the present invention.

A semiconductor device according to a fourth embodiment of the present invention and a manufacturing method for the semiconductor device will now be described with reference to FIG. 30. The fourth embodiment differs from the third embodiment in that a lower surface of an n-type diffusion layer 43a is positioned in a SiGe alloy layer 36a. A silicon film 37a is one example of the second region. The n-type diffusion layer 43a is one example of the first region.

To manufacture the semiconductor device of the fourth embodiment, a SiGe alloy layer 36a having a thickness of about 40 nm and a silicon film 37a having a thickness of about 30 nm (about 70 nm in total) are formed by performing low-pressure CVD in process 3 of the third embodiment, and heat treatment is performed at about 1050° C. for about 5 seconds using an RTA apparatus in process 10. As a result, an n-type impurity of a polycrystalline silicon film 38a is diffused by about 40 nm toward a collector layer 32 so that the n-type impurity passes through the silicon film 37a having a thickness of about 30 nm and enters the SiGe alloy layer 36a.

The manufacturing method of the fourth embodiment has the advantages described below in addition to the advantages described in the third embodiment.

The lower surface of the n-type diffusion layer 43a is positioned in the SiGe alloy layer 36a. In this case, the distance between the lower surface of the n-type diffusion layer 43a functioning as an emitter layer and the active region A1

(collector layer 32) is shorter than when the lower surface of the n-type diffusion layer 43a is not positioned in the SiGe alloy layer 36a. This shortens the time taken by electrons to travel from the emitter layer side to the collector layer and enables the transistor to operate at higher speeds. As a result, the semiconductor device has higher performance.

In this case, the emitter injection efficiency is higher and the current amplification factor is higher as compared with when the lower surface of the n-type diffusion layer 43a (emitter-base junction portion) is not positioned in the SiGe alloy layer 36a (when the lower surface of the n-type diffusion layer 43a is positioned in the silicon film 37a). This is because the band gap of the SiGe alloy layer is narrower than the band gap of the silicon film when the lower surface of the n-type diffusion layer 43a is positioned in the SiGe alloy layer 36a and the barrier against electrons injected from the emitter layer to the base layer is lower as compared with when the lower surface of the n-type diffusion layer 43a is positioned in the silicon film 37a. As a result, the barrier against electrons injected from the emitter layer into the base layer is lower than the barrier against positive holes injected from the base layer into the emitter layer. As a result, the emitter injection efficiency is higher, and the current amplification factor is higher. This enables the semiconductor device to have higher performance.

A semiconductor device and a manufacturing method for the semiconductor device according to a fifth embodiment of the present invention will now be described with reference to FIGS. 32 to 43. The fifth embodiment differs from the third embodiment in that portions of a p$^+$ diffusion layer 42a1 connected to a base region and a silicide film 45b1 extend from an opening A2 of a silicon oxide film (protective film) 34 over the silicon oxide film surrounding the opening A2. Except for this point, the fifth embodiment is the same as the third embodiment.

Figure 33:
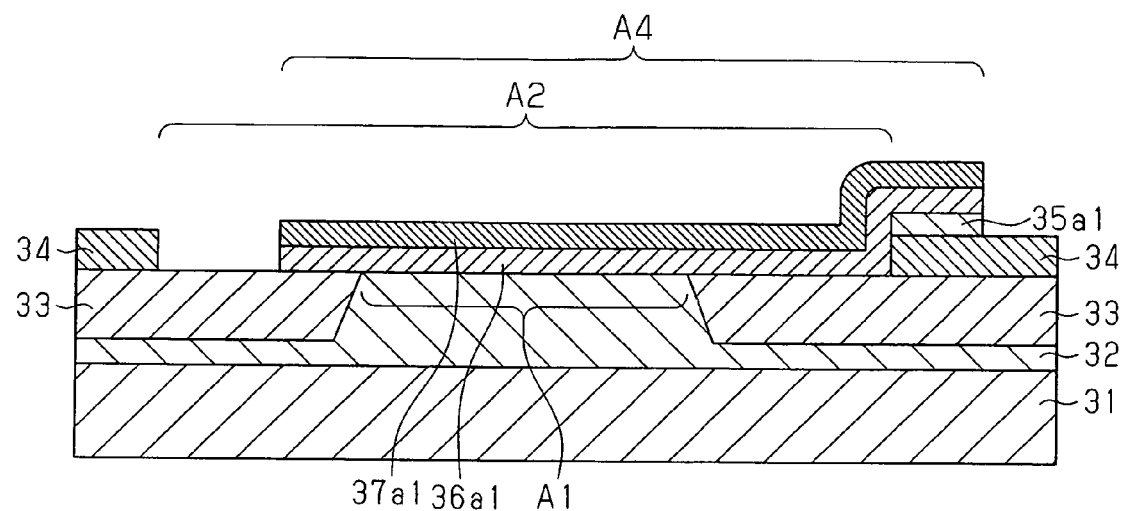
FIGS. 33 to 43 are cross-sectional views describing the manufacturing processes of the semiconductor device of FIG. 32.

FIG. 33 and FIGS. 35 to 43 are cross-sectional views showing the manufacturing processes of the semiconductor device in the fifth embodiment. FIG. 33 is a cross-sectional view of the semiconductor device taken along line 33-33 in FIG. 34.

[Process 4A: FIGS. 19 and 33]

Figure 34:
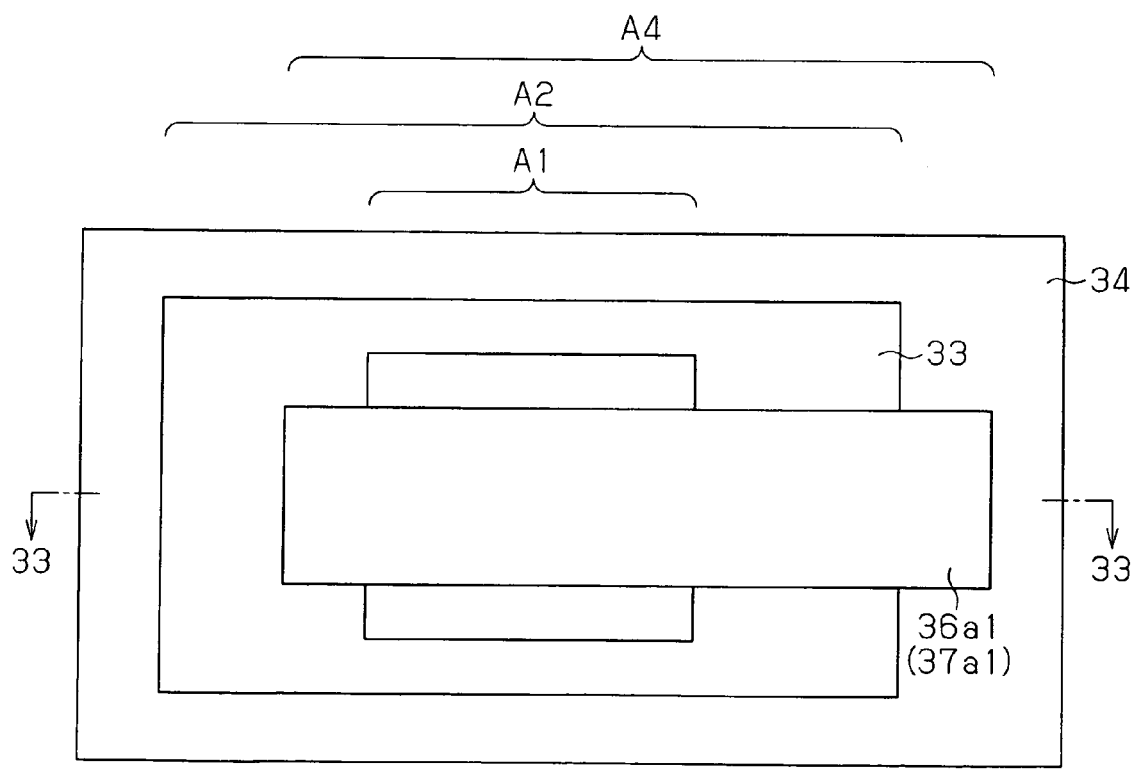

After processes 1 to 3 described in the third embodiment, a resist pattern (not shown) is formed by performing lithography. Unnecessary portions of the silicon film 37 and SiGe alloy layer 36 are removed by performing dry etching. Unnecessary portions of the polycrystalline silicon film 35 are also removed by performing etching. This resist pattern is patterned in a manner that the silicon film 37 and the SiGe alloy layer 36 extend over a silicon oxide film (protective film) 34. As a result, a SiGe alloy layer 36a1 used as a base region and a silicon film 37a1 are formed to have a predetermined pattern A4 extending from positions within the opening A2 over the silicon oxide film 34 as shown in FIGS. 33 and 34. The dry etching may be performed, for example, under conditions in which the pressure: 2.0 Pa (15 mT); the gas flow rate O$_2$/HBr: 2/180 ml/minute; and the RF power Upper/Lower: 250 W/12 W. Although the SiGe alloy layer 36b, which functions as a spacer, is formed on the side surface (opening edge) of the silicon oxide film 34 in the third embodiment, a side surface (opening edge) portion of the silicon oxide film 34 corresponding to the SiGe alloy layer 36b is completely removed in the present embodiment by adjusting the etching time.

Figure 35:
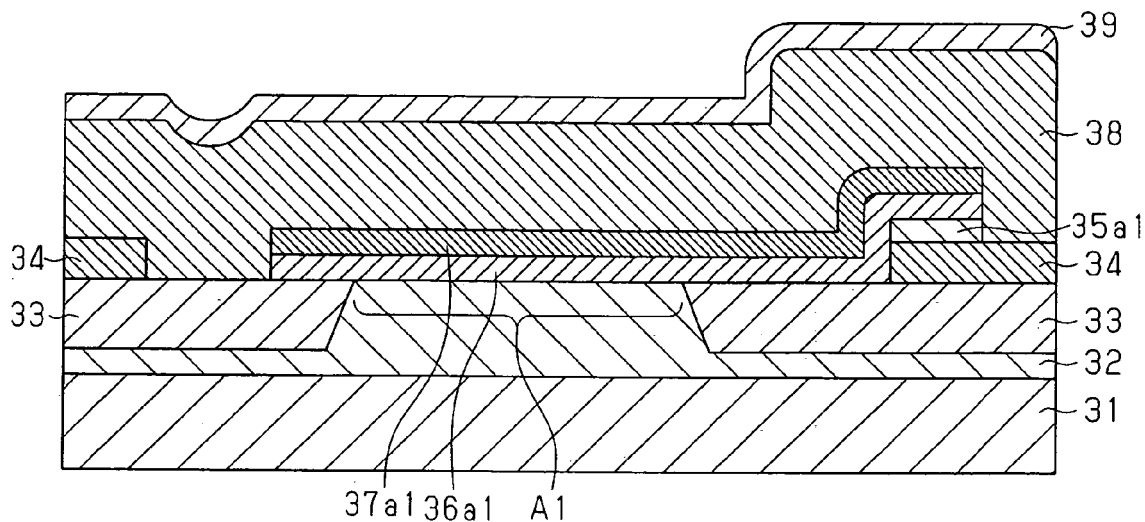

[Process 5A: FIG. 35]

A polycrystalline silicon film 38, which is doped with an n-type impurity at a concentration of about $1 \times 10^{20}$ cm$^{-3}$ or more, is formed by performing low-pressure CVD. A silicon nitride film 39 is formed on the polycrystalline silicon film 38. Arsenic or phosphorus may be used as the n-type impurity. The thickness of the polycrystalline silicon film 38 is preferably controlled to be about 200 nm. The thickness of the silicon nitride film 39 is preferably controlled to be about 50 nm.

Figure 36:
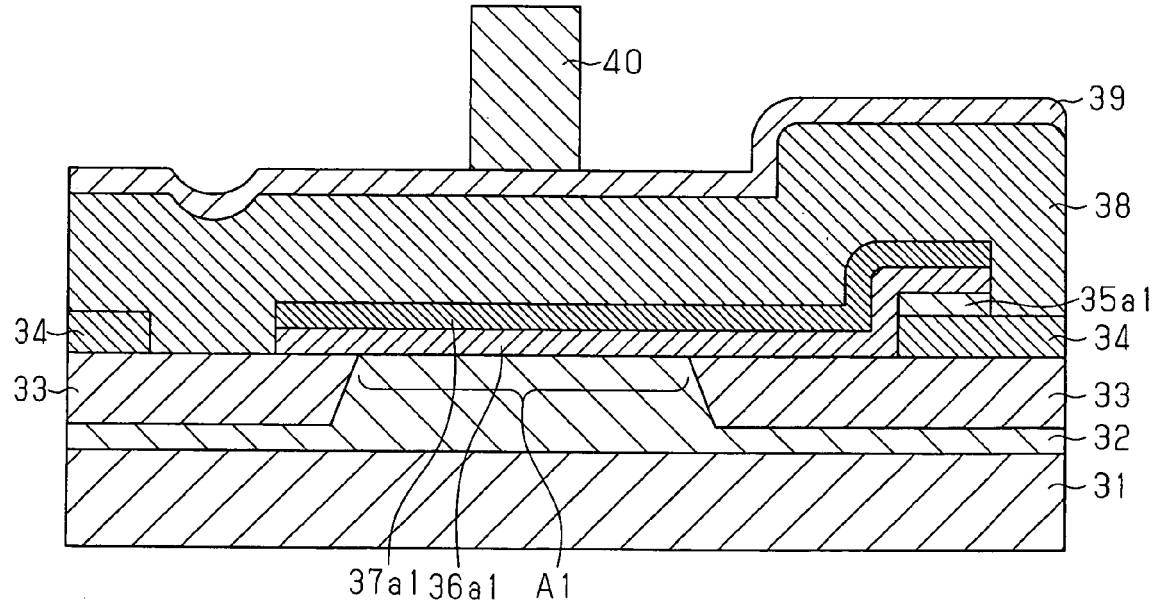

[Process 6A: FIG. 36]

A resist pattern 40 for forming a desired emitter electrode is formed within an opening A2, which defines a bipolar transistor formation region or pit, by performing lithography.

Figure 37:
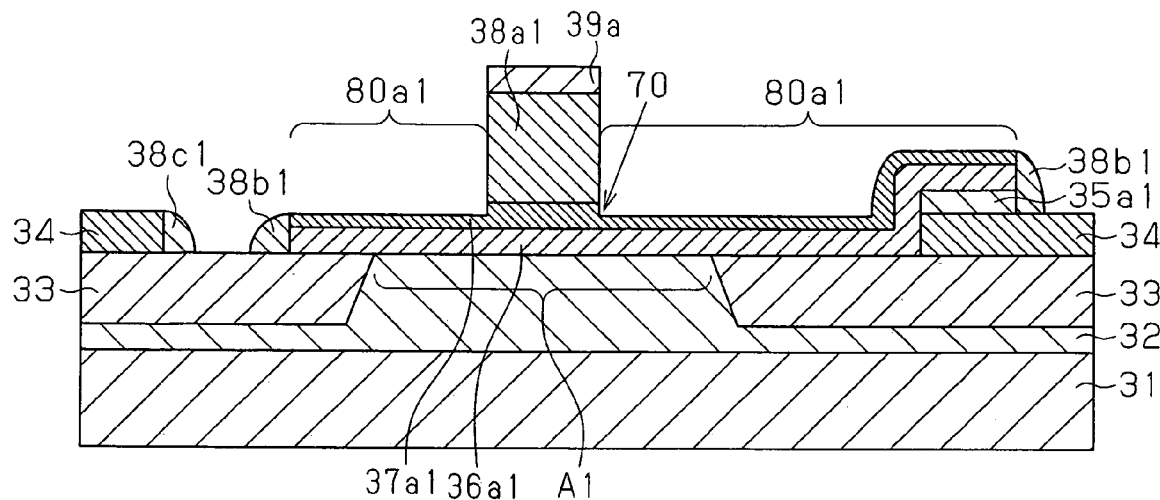

[Process 7A: FIG. 37]

The silicon nitride film 39, the polycrystalline silicon film 38, and the silicon film 37a1 are etched by performing dry etching sequentially in the stated order. The dry etching is not performed until the silicon film 37a1 is completely removed and is stopped when the silicon film 37a1 still remains on the entire surface of the SiGe alloy layer 36a1. As a result, the silicon film 37a1 is processed to have a reverse T-shaped cross-section with a projection 70. Further, a surface 80a1 of the silicon film 37a1 is damaged by the etching so that a damaged layer is formed on the surface 80a1. The polycrystalline silicon film 38 is processed as a polycrystalline silicon film 38a1, which functions as an emitter electrode, a side wall film 38b1, which is formed by a polycrystalline silicon film and surrounds the SiGe alloy layer 36a1 and the silicon film 37a1, and a side wall film 38c1, which is formed by a polycrystalline silicon film and arranged on the side surface (opening edge) of the silicon oxide film 34. The silicon nitride film 39 is processed as a silicon nitride film 39a and functions as a mask when the polycrystalline silicon film 38 is etched. The dry etching may be performed, for example, under conditions in which the pressure: 2.0 Pa (15 mT); the gas flow rate O$_2$/HBr: 2/180 ml/minute; and the RF power Upper/Lower: 250 W/12 W.

In the same manner as in the third embodiment, as the dry etching of the polycrystalline silicon film 38 continues, the silicon oxide film 34 becomes exposed at positions other than the opening (bipolar transistor formation region) A2 and the predetermined pattern A4 when the silicon film 37a1 is exposed. Although the etching control of different members made of the same material (the polycrystalline silicon film 38 and the silicon film 37a1 in the present embodiment) is normally difficult, the point at which the silicon oxide film 34 is exposed is controllable using end point control employed in normal dry etching. The point of time in which the silicon oxide film 34 is exposed is regarded as the point of time in which the silicon film 37a1 is exposed. In this way, the silicon film 37a1 is etched in a favorably controlled manner. This enables the silicon film 37a1 to be processed to have a reverse T-shaped cross-section with highly accurate repeatability.

Figure 38:
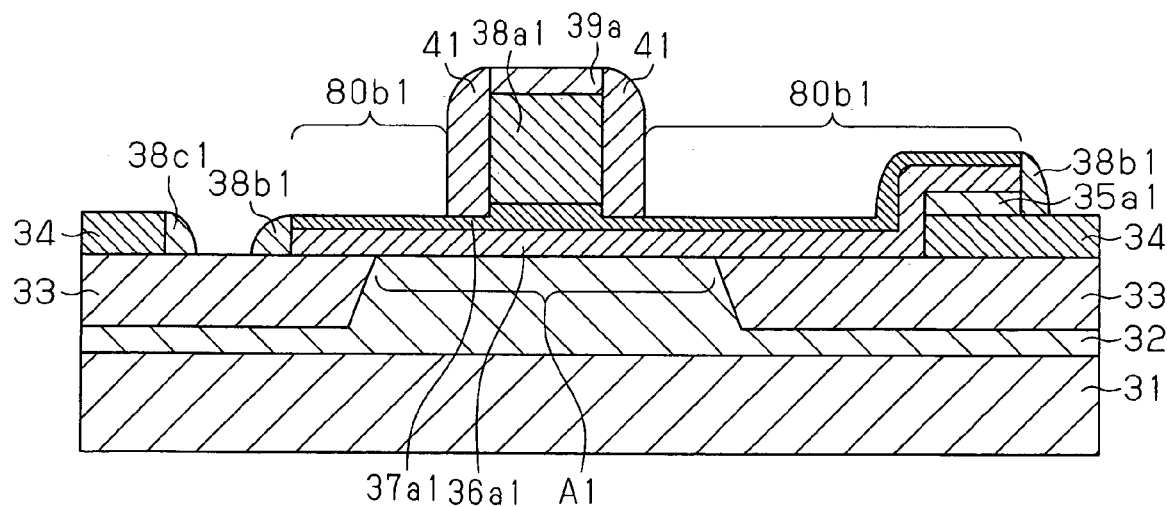

[Process 8A: FIG. 38]

A silicon oxide film, which is an insulative film, is formed by performing CVD. Then, the entire film surface is etched back by performing dry etching, so that a side wall film 41 formed by a silicon oxide film surrounds the silicon nitride film 39a, the polycrystalline silicon film 38a1, and the projection 70 of the silicon film 37a1. A surface 80b1 of the silicon film 37a1 is further damaged by the dry etching so that a damaged layer is formed on the surface 80b1. The silicon oxide film may be formed, for example, by heating a mixture of TEOS and O$_2$ at about 720° C. The thickness of the silicon oxide film is about 200 nm. The dry etching may be performed, for example, under conditions in which the pressure: 33 Pa (250 mT); the gas flow rate CHF$_3$/CF$_4$/Ar: 20/20/400 ml/minute (sccm); and the RF power: 395 W.

Figure 39:
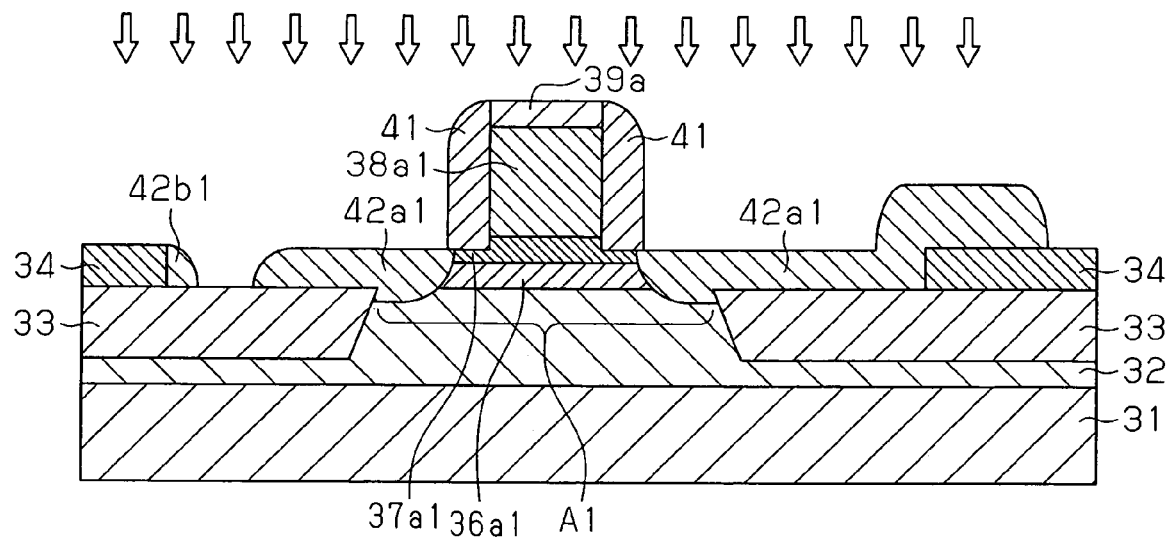

[Process 9A: FIG. 39]

Boron is ion-implanted in the silicon oxide film by ion implantation. The structure is then subjected to heat treatment to cause activation in the film to form a p+ diffusion layer 42a1, which functions as an external base layer. The side wall film 38c1 formed on the side surface (opening edge) of the silicon oxide film 34 is formed as a p+ diffusion layer 42b1. As one example, $BF_2$ may be implanted with electron acceleration energy in a range of about 1 to 40 keV to have a concentration in a range of $1\times10^{14}$ to $5\times10^{15}$ cm$^{-2}$. Under such ion implantation conditions, ions do not pass through the silicon nitride film 39a having a thickness of about 50 nm, which is on the polycrystalline silicon film 38a1. Thus, boron is prevented from being implanted into the polycrystalline silicon film 38a1.

Figure 40:
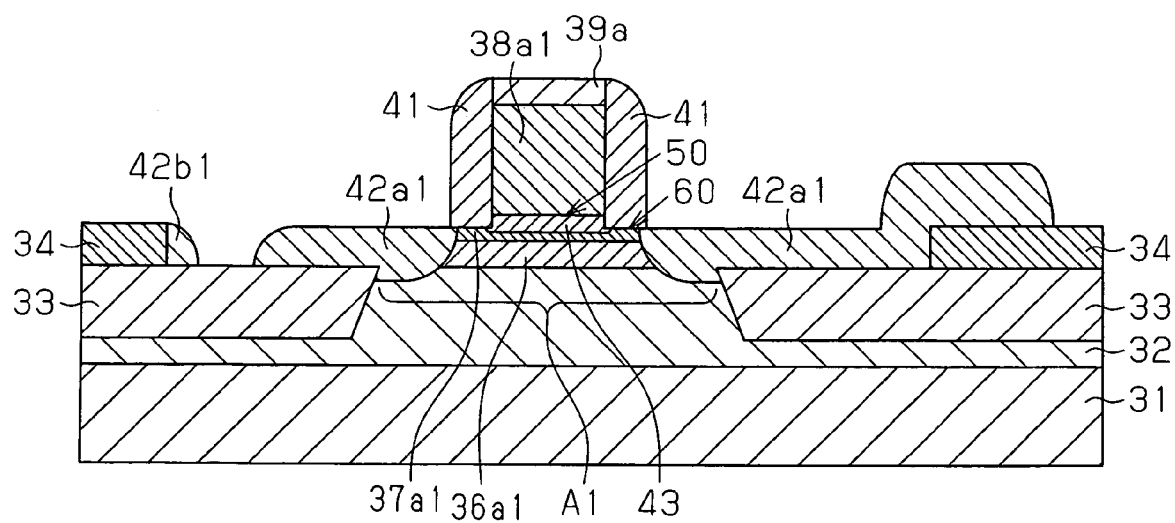

[Process 10A: FIG. 40]

Then, heat treatment is performed to cause the n-type impurity in the polycrystalline silicon film 38a1 to diffuse into the silicon film 37a1 and form an n-type diffusion layer 43. As a result, an emitter-base junction is formed in the silicon film 37a1. The heat treatment is performed at about 1050° C. for about 5 to 30 seconds using an RTA apparatus.

The emitter layer (n-type diffusion layer) 43 in the silicon film 37a1 is formed by diffusing the n-type impurity from the polycrystalline silicon film 38a1. The diffusion normally occurs not only in the depthwise direction but also in the lateral direction of the layer. The resulting effective emitter width may become wider than the width of the polycrystalline silicon film 38a1. However, in the fifth embodiment, the contact surface 50 of the emitter layer (n-type diffusion layer) 43 and the emitter electrode (polycrystalline silicon film) 38a1 is higher than the lower surface 60 of the side wall film 41. Thus, the side wall film 41 functions as a barrier for diffusion and regulates diffusion of the impurity in the lateral direction of the n-type diffusion layer 43. As a result, the width of the emitter layer is reduced.

Figure 41:
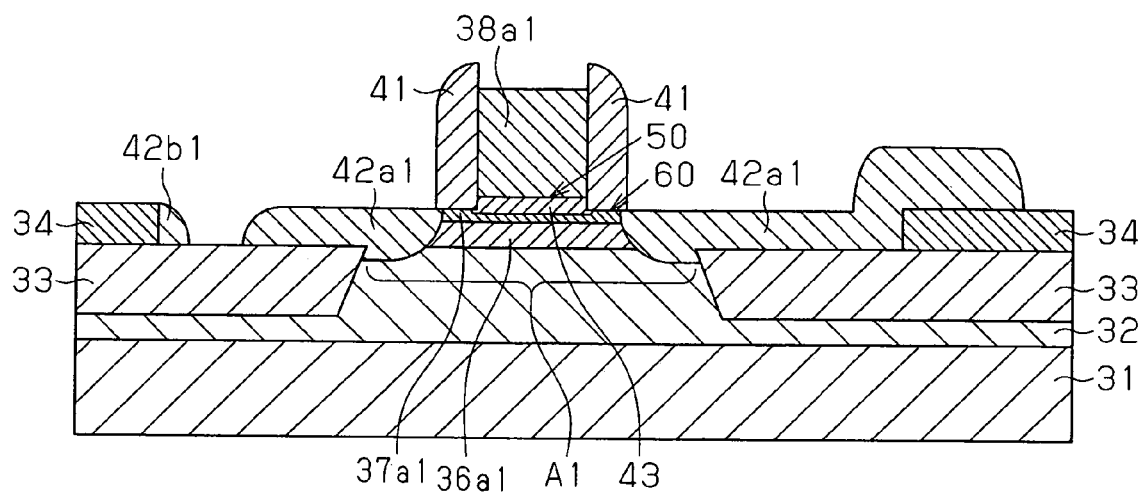

[Process 11A: FIG. 41]

After the heat treatment, the silicon nitride film 39a on the base electrode (not shown), the emitter electrode, and the collector electrode (not shown) is removed using diluted hydrofluoric acid and phosphoric acid.

Figure 42:
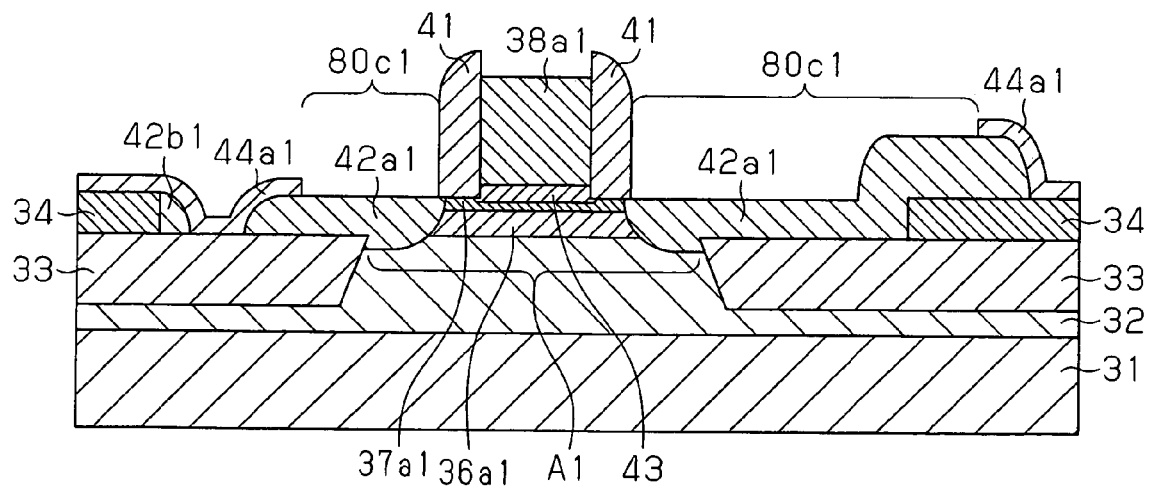

[Process 12A: FIG. 42]

A silicon oxide film, which is an insulative film, is formed by performing CVD. Then, a resist pattern (not shown) is formed by performing lithography, and unnecessary portions of the silicon oxide film are removed by performing dry etching. As a result, a silicon oxide film 44a1 having an opening in its predetermined region and usable as a salicide block is formed. A surface 80c1 of the silicon film 37a1 is further damaged by the dry etching so that a damaged layer is formed on the surface 80c1. The silicon oxide film may be formed, for example, by heating a mixture of TEOS and $O_2$ at about 720° C. The thickness of the silicon oxide film is about 50 nm. The dry etching may be performed, for example, under conditions in which the pressure: 33 Pa (250 mT); the gas flow rate $CHF_3/CF_4$/Ar: 20/20/400 ml/minute; and the RF power: 395 W.

Figure 43:
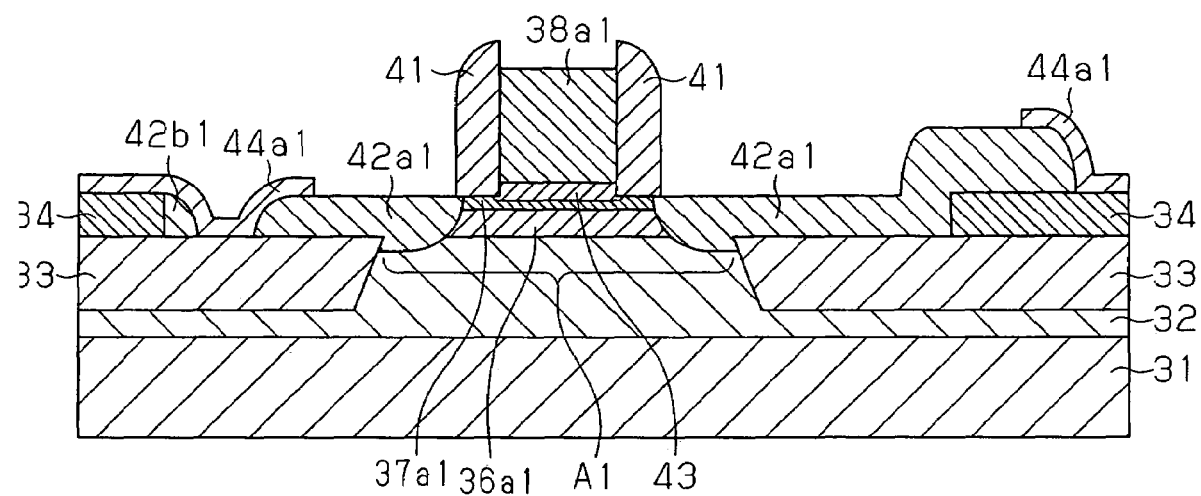

[Process 13A: FIG. 43]

The surfaces 80a1, 80b1, and 80c1 of the silicon film 37a1 are damaged by the etching performed in processes 7A, 8A, and 12A, which are performed before process 13A. A surface portion of the p+ diffusion layer 42a1 (silicon film 37a1) is removed by performing dry etching to remove the etching damages (damage layers). The dry etching may be performed, for example, under conditions in which the pressure: 166 Pa (1250 mT); the gas flow rate $O_2/CF_4$: 200/100 ml/minute; and the RF power: 450 W. These dry etching condition differ from the conditions used in processes 7A, 8A, and 12A, and is determined in a manner that the etching damage on the p+ diffusion layer 42a1 (silicon film 37a1) is small. It is preferable that this dry etching be controlled to remove the p+ diffusion layer 42a1 (silicon film 37a1) by a depth of, for example, about 10 nm. The timing at which the etching damages (damaged layers) are removed is the same as in the third embodiment.

Figure 32:
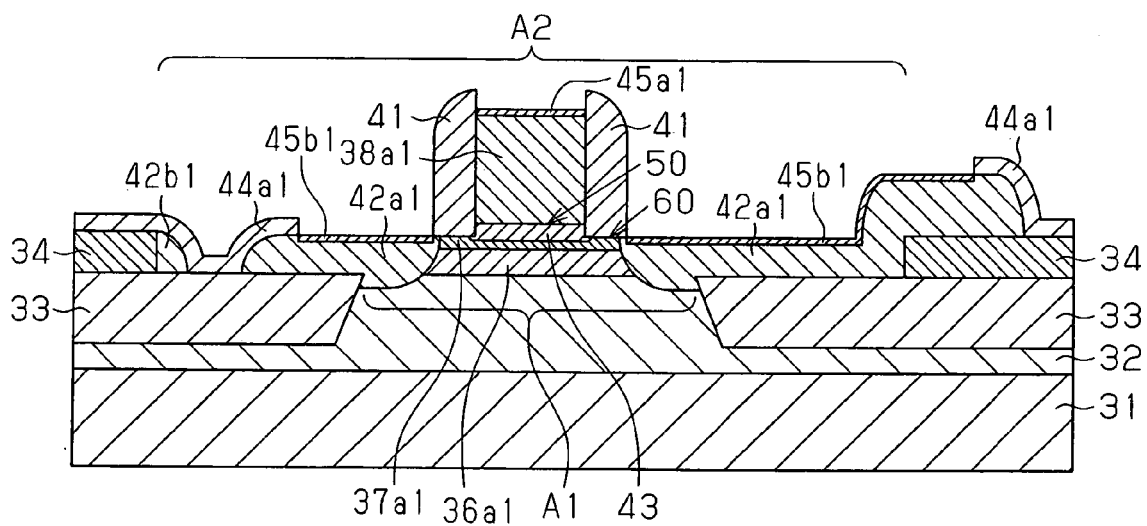
FIG. 32 is a cross-sectional view of a semiconductor device according to a fifth embodiment of the present invention.

[Process 14A: FIG. 32]

Layers of cobalt (Co) are formed on the surface of the polycrystalline silicon film 38a1 and the surface of the p+ diffusion layer 42a1. Then, heat treatment is performed to form cobalt silicide films (silicide films) 45a1 and 45b1. The sheet resistance of the silicide films 45a1 and 45b1 is about 7 $\Omega/\square$, which is much lower than the sheet resistance of 100 $\Omega/\square$ of the conventional p+-type SiGe layer (p+ diffusion layer 42a1). Thus, the parasitic resistance generated between the internal base layer and a base electrode (not shown) connected to the external base layer is reduced. In the silicide film formation process, layers of titanium may be formed instead of the cobalt layers to form titan silicide films. The same advantages are obtained in this case.

Next, although not shown, an inter-layer insulative film, such as a plasma TEOS film, is formed on the surface of the semiconductor substrate through deposition. Openings for contacts are formed in the collector electrode, the base electrode, and the emitter electrode of an NPN transistor. A barrier metal layer made of, for example, titanium and a conductive layer made of aluminum or an aluminum alloy are formed. This completes the manufacture of the bipolar transistor having an NPN transistor.

The manufacturing method for the semiconductor device of the fifth embodiment has the advantages described below in addition to the advantages described in the third embodiment.

Part of the p+ diffusion layer 42a1 functioning as an external base layer and part of the silicide film 45b1 are formed to extend from positions within the opening A2 over the silicon oxide film (protective film) 34. This increases the design freedom for arrangement of contacts of the base electrode.

The p+ diffusion layer 42a1 partially extends from the position within the opening A2 over the silicon oxide film 34. As a result, the thickness of the portion of the p+ diffusion layer 42a1 is greater on the silicon oxide film 34 than in the opening A2 by the thickness of the silicon film 37a1. This prevents etching variations (e.g. excessive etching) during the formation of contacts from causing contacts to pass through the p+ diffusion layer 42a1 when contacts of the base electrode are formed on the silicon oxide film 34. As a result, the manufacturing yield of the bipolar transistor (semiconductor device) is improved, and the bipolar transistor is obtained at a low cost.

Although the fifth embodiment describes an example in which the p+ diffusion layer 42a1 and the silicide film 45b1 extend over the silicon oxide film 34 at one of their sides, the present invention is not limited in such a manner. For example, the silicon film 37a1 and the SiGe alloy layer 36a1 may be processed linearly in process 4A, and the two ends of each of the silicon film 37a1 and the SiGe alloy layer 36a1 may also be formed on the silicon oxide film (protective film) 34. The same advantages as described in the fifth embodiment are obtained in this case.

In the fifth embodiment, the lower surface of the n-type diffusion layer 43 may be positioned in the SiGe alloy layer 36a1. In this case, advantages (7) and (8) described in the fourth embodiment are obtained.

The present invention is applicable to various bipolar transistors.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A method for manufacturing a semiconductor device, the method comprising:
   a first step of forming a conductive layer and a silicon film functioning as a base layer on a semiconductor substrate including an active region surrounded by an isolation film;
   a second step of forming an emitter electrode containing a first impurity on the silicon film above the active region;
   a third step of partially etching the silicon film using the emitter electrode as a mask;
   a fourth step of forming an insulative film entirely covering the semiconductor substrate and then etching back the insulative film to form a side wall film covering a side surface of the emitter electrode;
   a fifth step of introducing a second impurity into the conductive layer and the silicon film so that the second impurity reaches the active region to form an impurity region containing the second impurity in part of the conductive layer and part of the silicon film; and
   a sixth step of diffusing the first impurity contained in the emitter electrode into a surface of the silicon film to form in the silicon film a first region containing the first impurity and a second region free of the first impurity;
   wherein the third step includes forming the silicon film to have a reversed T-shape so that a contact surface between the first region and the emitter electrode is located above a lower surface of the side wall film when the fourth step is completed; and
   the sixth step includes forming the first and second regions in the silicon film so that at least part of the second region is positioned between the conductive layer and the side wall film and is in contact with both the conductive layer and the side wall film.

2. The method according to claim 1, wherein the conductive layer is a silicon-germanium alloy layer, and the first region has a lower surface arranged in the conductive layer.

3. The method according to claim 2, wherein the first region is in contact with the conductive layer.

4. The method according to claim 1, further comprising:
   a seventh step of forming a silicide film on the impurity region after the sixth step; and
   an eighth step of removing a damaged layer from the impurity region at least before the seventh step.

5. The method according to claim 4, wherein the step of removing a damaged layer is performed only once immediately before the seventh step.

6. The method according to claim 5, wherein the step of removing a damaged layer is not performed before the sixth step is completed.

7. The method according to claim 1, wherein the silicon film includes a portion located above the active region, and the second step includes forming the emitter electrode to contact at least an upper surface of said portion of the silicon film.

8. The method according to claim 1, wherein the third step includes selectively removing the silicon film excluding a contact surface between the silicon film and the emitter electrode.

9. The method according to claim 8, wherein the third step includes forming the silicon film to have a reversed T-shape so that a contact surface between the silicon film and the emitter electrode is located at a level differing from that of the surface of the silicon film excluding the contact surface.

10. The method according to claim 1, wherein the fourth step includes forming the side wall film to cover part of the side surface of the emitter electrode and part of the surface of the silicon film.

11. The method according to claim 1, wherein the fifth step includes introducing the second impurity into parts of the conductive layer, the silicon film, and the active region so that the impurity region extends over said parts of the conductive layer, the silicon film, and the active region.

12. The method according to claim 1, wherein the fifth step includes adjusting the introduction of the second impurity so that a lowest surface of the impurity region is located at a level lower than that of a boundary surface between the conductive layer and the active region.

13. A method for manufacturing a semiconductor device, the method comprising:
   a first step of forming a protective film having an opening on a semiconductor substrate including an active region surrounded by an isolation film, the active region having a surface arranged in the opening;
   a second step of forming a conductive layer and a silicon film functioning as a base layer in the opening of the protective film;
   a third step of forming an emitter electrode containing a first impurity on the silicon film above the active region;
   a fourth step of partially etching the silicon film using the emitter electrode as a mask;
   a fifth step of forming a side wall film covering a side surface of the emitter electrode;
   a sixth step of introducing a second impurity into the conductive layer and the silicon film so that the second impurity reaches the surface of the active region to form an impurity region containing the second impurity in parts of the conductive layer and silicon film; and
   a seventh step of diffusing the first impurity contained in the emitter electrode into the silicon film to form a first region containing the first impurity and a second region free of the first impurity in the silicon film;
   wherein the fourth step includes forming the silicon film to have a reversed T-shape so that a contact surface between the first region and the emitter electrode is located above a lower surface of the side wall film when the fifth step is completed; and
   the seventh step includes forming the first and second regions in the silicon film so that at least part of the second region is positioned between the conductive layer and the side wall film and is in contact with both the conductive layer and the side wall film.

14. The method according to claim 13, wherein the conductive layer is a silicon-germanium alloy layer, and the first region has a lower surface arranged in the conductive layer.

15. The method according to claim 13, wherein the protective film has an upper surface located below the contact surface between the first region and the emitter electrode.

16. The method according to claim 13, wherein the first step includes forming the opening of the protective film so that the opening of the protective film has a greater dimension than the surface of the active region along the semiconductor substrate.

17. The method according to claim 13, wherein the first step includes locally removing part of the protective film so that the protective film does not cover the active region.

18. The method according to claim 13, wherein the first step includes locally forming the protective film on a portion of a surface of the isolation film excluding the active region so that the protective film does not cover the active region.

* * * * *